(12) United States Patent
Scholvin et al.

(10) Patent No.: US 8,939,774 B2
(45) Date of Patent: Jan. 27, 2015

(54) METHODS AND APPARATUS FOR THREE-DIMENSIONAL MICROFABRICATED ARRAYS

(71) Applicants: Jorg Scholvin, Cambridge, MA (US); Anthony Zorzos, Cambridge, MA (US); Clifton Fonstad, Arlington, MA (US); Edward Boyden, Chestnut Hill, MA (US)

(72) Inventors: Jorg Scholvin, Cambridge, MA (US); Anthony Zorzos, Cambridge, MA (US); Clifton Fonstad, Arlington, MA (US); Edward Boyden, Chestnut Hill, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 106 days.

(21) Appl. No.: 13/674,894

(22) Filed: Nov. 12, 2012

(65) Prior Publication Data
US 2013/0157498 A1 Jun. 20, 2013

Related U.S. Application Data

(60) Provisional application No. 61/558,704, filed on Nov. 11, 2011.

(51) Int. Cl.
*H01R 12/00* (2006.01)
*G01R 1/073* (2006.01)
*H01R 4/02* (2006.01)
(Continued)

(52) U.S. Cl.
CPC ............ *G01R 1/07314* (2013.01); *H01R 4/027* (2013.01); *B23K 20/00* (2013.01); *C25D 3/00* (2013.01); *H01R 13/03* (2013.01); *H05K 1/00* (2013.01); *H05K 3/242* (2013.01); *C25D 5/022* (2013.01); *C23C 18/1608* (2013.01); *H05K 1/18* (2013.01); *H05K 2201/10083* (2013.01)
USPC .............................................. 439/65; 361/785

(58) Field of Classification Search
USPC ............... 439/64, 65, 377; 361/785; 600/544, 600/372, 373
See application file for complete search history.

(56) References Cited

U.S. PATENT DOCUMENTS

| 4,855,871 | A | 8/1989 | Young |
| 6,086,599 | A | 7/2000 | Lee et al. |

(Continued)

OTHER PUBLICATIONS

A. Aarts, H. Neves, I. Ulbert, L. Wittner, L. Grand, M. Fontes, S. Herwik, S. Kisban, O. Paul, P. Ruther, R. Puers, C. Van Hoof, A 3D Slim-Base Probe Array for In Vivo Recorded Neuron Activity, Conf. Proc IEEE Engineering in Medicine and Biology Society, Aug. 2008; EMBS 2008, pp. 5798-5801.

(Continued)

*Primary Examiner* — Thanh Tam Le
(74) *Attorney, Agent, or Firm* — Stephen R. Otis

(57) ABSTRACT

In exemplary implementations of this invention, electrical connections are fabricated between two orthogonal surfaces by electroplating. The two surfaces are separated (except for the electrical connections) by a gap of not more than 100 micrometers. Multiple electrical connections may be fabricated across the gap. In preparatory steps, conductive pads on the two surfaces may be separately electroplated to build up "bumps" that make it easier to bridge the remainder of the gap in a final plating step. Alternately, electroless deposition may be used instead of electroplating. In exemplary implementations, a 3D probe array may be assembled by inserting array structures into an orthogonal base plate. The array structures may be aligned and held in place, relative to the base plate, by mechanical means, including side hooks, stabilizers, bottom hooks, alignment parts and a back plate.

19 Claims, 22 Drawing Sheets

(51) Int. Cl.

| | |
|---|---|
| *B23K 20/00* | (2006.01) |
| *C25D 3/00* | (2006.01) |
| *H01R 13/03* | (2006.01) |
| *H05K 1/00* | (2006.01) |
| *H05K 3/24* | (2006.01) |
| *C25D 5/02* | (2006.01) |
| *C23C 18/16* | (2006.01) |
| *H05K 1/18* | (2006.01) |

(56) References Cited

U.S. PATENT DOCUMENTS

| | | | |
|---|---|---|---|
| 6,184,477 | B1 | 2/2001 | Tanahashi |
| 6,239,012 | B1 * | 5/2001 | Kinsman ............... 438/612 |
| 7,077,658 | B1 * | 7/2006 | Ashman et al. ............ 439/65 |
| 7,212,851 | B2 * | 5/2007 | Donoghue et al. ......... 600/544 |
| 7,618,283 | B1 * | 11/2009 | Costello ................ 439/511 |
| 7,637,749 | B2 * | 12/2009 | Lang et al. ............. 439/65 |
| 8,038,451 | B2 * | 10/2011 | Peterson et al. ........ 439/65 |
| 8,261,428 | B2 * | 9/2012 | Fang et al. ............ 29/595 |
| 8,491,316 | B2 * | 7/2013 | Ikeuchi et al. ......... 439/79 |
| 2004/0175879 | A1 | 9/2004 | Amador et al. |
| 2007/0087474 | A1 * | 4/2007 | Eklund et al. ......... 438/106 |
| 2010/0178810 | A2 | 7/2010 | Aarts et al. |
| 2010/0229384 | A1 | 9/2010 | Krulevitch et al. |

OTHER PUBLICATIONS

S. Herwik, S. Kisban, A. Aarts, K. Seidl, G. Girardeau, K Benchenane, M. Zugaro, S. Wiener, O. Paul, H. Neves, P. Ruther, Fabrication technology for silicon-based microprobe arrays used in acute and sub-chronic neural recording, Journal of Micromechanics and Microengineering, vol. 19, No. 7, 074008 (2009).

Y. Lee, C. Lin, C. Lin, S. Yeh, Y. Chang, W. Fang, A pseudo 3D glass microprobe array: glass microprobe with embedded silicon for alignment and electrical interconnection during assembly; Journal of Micromechanics and Microengineering, vol. 20, No. 2, 025014 (2009).

C. Chang, J. Chiou, Development of a Three Dimensional Neural Sensing Device by a Stacking Method, 2010 IEEE Sensors, pp. 2342-2345 (Nov 4, 2010).

K. Wise, A. Sodagar, Y. Yao, M. Gulari, G. Perlin, K. Najafi, Microelectrodes, Microelectronics, and Implantable Neural Microsystems, Proceedings of the IEEE, vol. 96, Issue 7, pp. 1184-1202 (Jul. 2008).

Structure Probe, Inc. SPI Conductive Silver Paste Plus. Webpage accessed on Nov. 11, 2014 at http://www.2spi.com/catalog/spec_prep/cond_paints2c.php.

Amazon, Inc. 5 pieces 0.3ML Silver Conductive Wire Glue Paste for Electronics Repair Applications. Webpage accessed on Nov. 11, 2014 at http://www.amazon.com/pieces-Silver-Conductive-Electronics-Applications/dp/B00FEFTHK0.

Alias, R., et al., 2012, Rheological Behaviors and Their Correlation with Printing Performance of Silver Paste for LTCC Tape. Chapter 13 of Rheology, edited by Juan De Vicente, ISBN 978-953-51-0187-1, Publisher: InTech, Chapters published Mar. 7, 2012. Accessed online on Nov. 11, 2014 at http://www.intechopen.com/books/rheology/rheological-behaviors-and-their-correlation-with-printing-performance-of-silver-paste-for-ltcc-tape.

Hosel, M., Screen printing. Webpage accessed online on Nov. 11, 2014 at http://plasticphotovoltaics.org/lc/lc-fabrication/lc-printing/lc-screen.html.

* cited by examiner

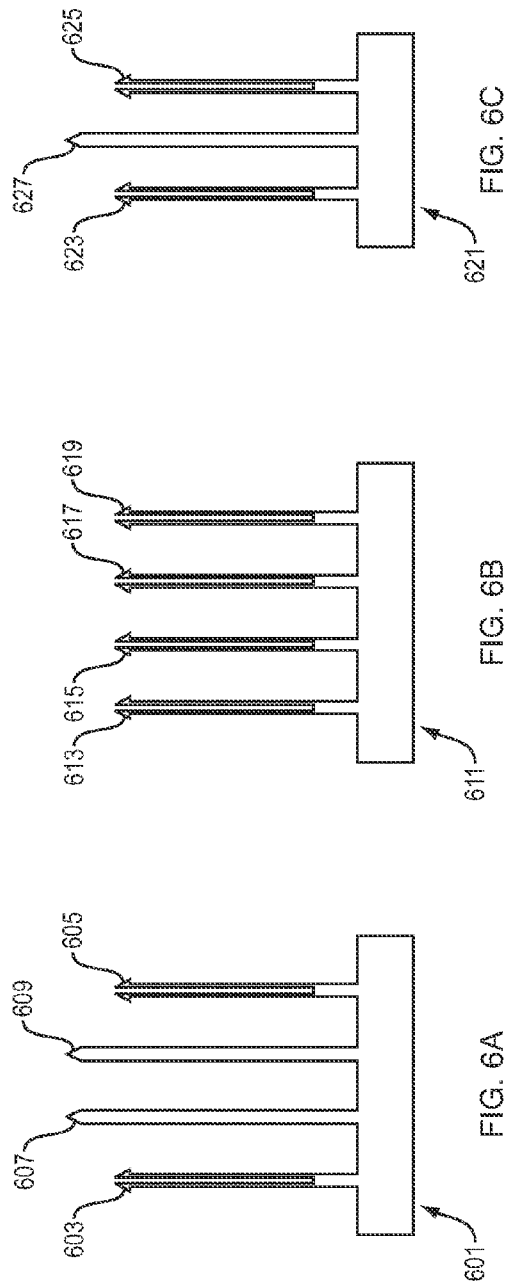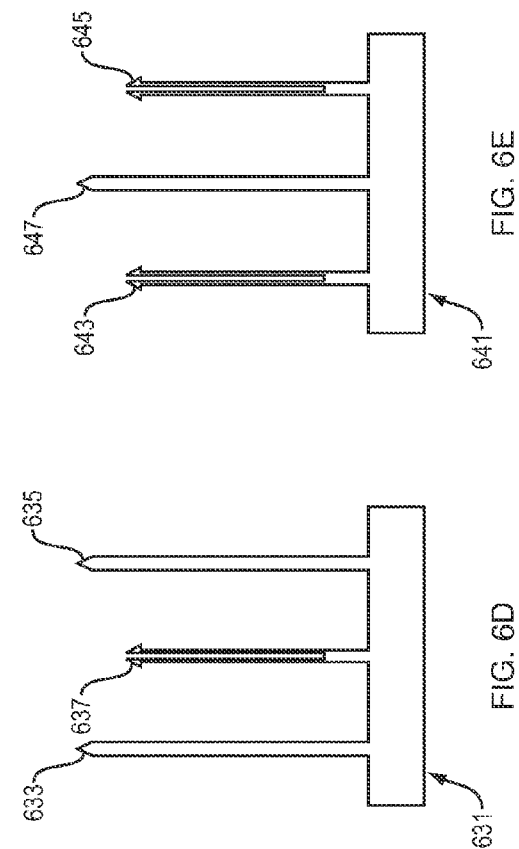

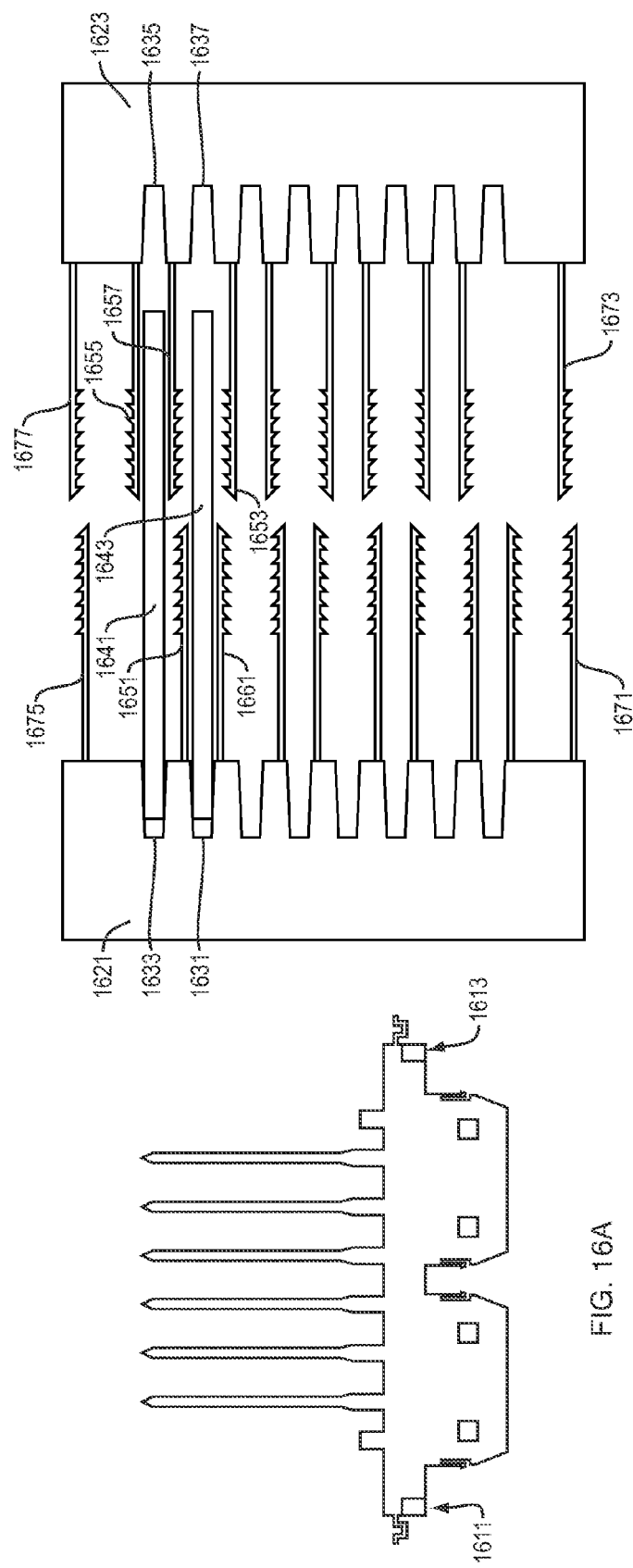

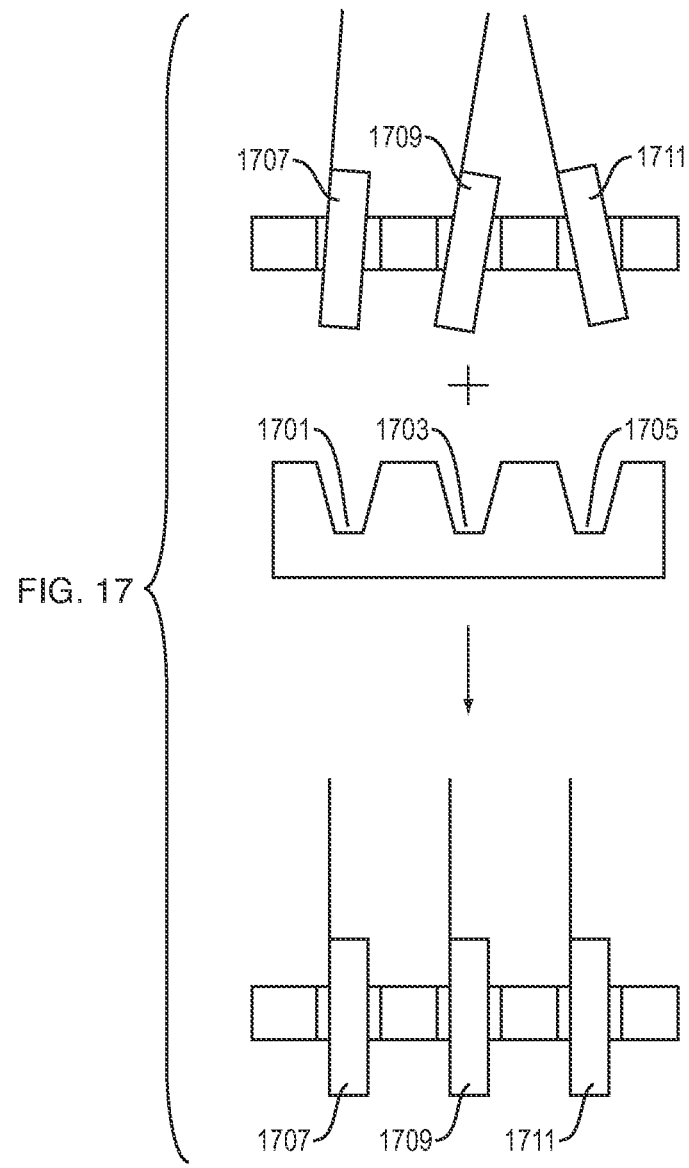

METHODS AND APPARATUS FOR THREE-DIMENSIONAL MICROFABRICATED ARRAYS

RELATED APPLICATIONS

This application is a non-provisional of, and claims the benefit of the filing date of, United States Provisional Application Ser. No. 61/558,704, filed Nov. 11, 2011, the entire disclosure of which is herein incorporated by reference.

STATEMENT REGARDING FEDERALLY SPONSORED RESEARCH OR DEVELOPMENT

This invention was made with U.S. government support under Grant Numbers NIH 1R43NS070453, NIH 1R01DA029639, and NIH 1DP2OD002002, each awarded by the National Institute of Health, and under Grant Number NSF EFRI 0835878, awarded by the National Science Foundation. The government has certain rights in this invention.

FIELD OF THE TECHNOLOGY

The present invention relates generally to microfabricated structures.

SUMMARY

In exemplary implementations of this invention, microfabricated structures are mechanically assembled, and electrical connections created between them. The structures may contain electrical wiring, microfabricated optical waveguides or even integrated circuits or other micromechanical systems (MEMS) components.

In exemplary implementations of this invention, silicon-based 3D microelectrode arrays (a) have customizable electrode locations, (b) can be targeted to defined neural substrates distributed in a 3-D pattern throughout a neural network in the mammalian brain, and (c) are compatible with simultaneous use of a diversity of existing light delivery devices. The design of these 3-D electrode arrays allows for easy electrical and mechanical assembly of the arrays. It also permits scaling of arrays to up to at least 1000 neural recording channels.

Conventionally, silicon-based electrodes are arranged in a 1-dimensional linear array, or 2-dimensional comb-like fashion. The combs use conventional linear or tetrode-style electrode locations along the comb's fingers, with stereotyped spacing and pad sizes.

In contrast, in exemplary implementations of this invention: A software-driven approach enables variable spacing and pad sizes, so that electrode geometries can be customized to the cellular properties of the brain circuits under investigation. To facilitate the assembly of such electrode arrays into a 3-dimensional array, electrical and mechanical connector strategies make assembly automated and reliable. Data is acquired and amplified in ways that simplify the use of these probes in an intact, in vivo, mammalian context. Hybrid electrodes contain both a low-impedance metallic pad for recording of spike activity, as well as an indium tin oxide (ITO) pad that can report local field potentials (LFPs) without the photoelectrochemical artifacts common in optogenetics. These 3-D probes are easy to use, from design to surgery. A user-friendly interface that enables neuroscientists to specify probe geometries based upon neural target geometries and coordinates. The 3-D probes may be used in vivo.

In exemplary implementations of this invention, electrical connections are fabricated between two orthogonal surfaces by electrolytic electroplating. The two surfaces are separated (except for the electrical connections) by a gap of not more than 100 micrometers. Multiple electrical connections may be fabricated across the gap. The pitch between the electrical connections may vary, depending on the particular implementation. For example, the pitch may be less than 50 micrometers. Or, for example, the pitch may be larger if the total number of connections is not too large. Often, it is desirable to make the pitch between connections proportional to the gap that needs to be bridged. In preparatory steps, conductive pads on the two surfaces may be separately electroplated to build up "bumps" that make it easier to bridge the remainder of the gap in a final plating step. Alternately, electroless deposition may be used instead of electroplating.

In exemplary implementations, a 3D probe array may be assembled by inserting array structures into an orthogonal base plate. The array structures may be aligned and held in place, relative to the base plate, by mechanical means, including side hooks, stabilizers, bottom hooks, alignment parts and a back plate.

The above description of the present invention is just a summary. It is intended only to give a general introduction to some illustrative implementations of this invention. It does not describe all of the details of this invention. This invention may be implemented in many other ways.

BRIEF DESCRIPTION OF THE DRAWINGS

FIG. 6A shows a stabilizer comprising two outer prongs with hooks and two inner prongs without hooks.

FIG. 6B shows a stabilizer comprising four prongs with hooks.

FIG. 6C shows a stabilizer comprising two outer prongs with hooks and one inner prong without hooks.

FIG. 6D shows a stabilizer comprising two outer prongs without hooks and one inner prong with hooks.

FIG. 6E shows a stabilizer comprising two outer prongs with hooks and one inner prong without hooks. It is similar to FIG. 6C, except that the spacing (pitch) between the prongs is greater than in FIG. 6C.

FIG. 9B shows a gap between an array structure and the base plate.

FIG. 12C shows a bridge that is part of a short-circuit employed during electroplating. The bridge may be broken off after electroplating.

In FIG. 13, a 3D probe array comprises a back plate, a base plate, a stabilizer, and array structures.

FIG. 15A shows two outer prongs that are solid and two inner prongs that have hooks. FIG. 15B shows four prongs, all of which are hooks.

FIG. 16A shows a side view of an array structure. The array structure has cutouts.

FIG. 16B shows a top view of array structures and alignment parts.

FIG. 17 is a diagram showing how a series of V-shaped slots may be used to stabilize array structures that are inserted into it.

Figure 1:
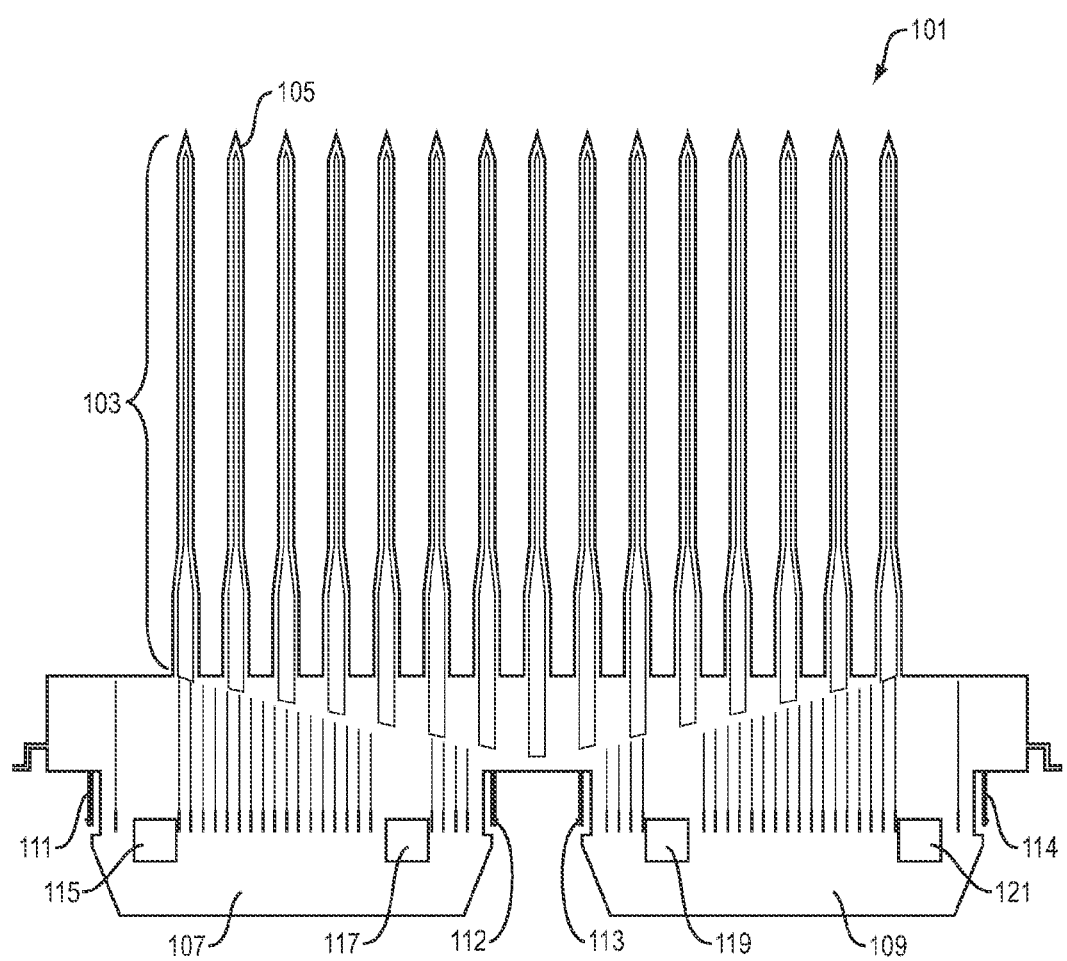
FIG. 1 shows a side view of an array structure.

The above Figures illustrate some illustrative implementations of this invention, or provide information that relates to those implementations. However, this invention may be implemented in many other ways. The above Figures do not show all of the details of this invention.

DETAILED DESCRIPTION

In exemplary implementations of this invention, a three-dimensional probe array is mechanically assembled, by inserting many two-dimensional structures into an orthogonal base-plate, and attaching them together. The insertion may be performed manually or may be robotically assisted. The 3D probe array is configured for in vivo insertion into mammalian tissue to measure electrical activity in the tissue.

In exemplary implementations, mechanical assembly is achieved in two ways, either independently or together. First, one or more array structures (e.g., 101 in FIG. 1) are inserted into a base plate (e.g., 201 in FIG. 2). The array structures may be attached to the base plate through the use of side hooks (411, 412, 413, 414 in FIG. 4A) on the sides of the array structures. Second, after inserting the array structures into the base plate, a stabilizer (301 in FIG. 3) can be inserted through openings in the array structures (FIGS. 5A, 5B). This provides an additional and more secure way of holding the array structures in place, and the side hooks provide for an irreversible, permanent assembly of the structure.

A side hook 411 may be designed so that, upon inserting the array structure 401 through the base plate 201 (downward), the side hook 411 snaps in place under the base plate 201, preventing it from falling out. An example of a side hook that has snapped into place is side hook 502 in FIG. 5A. The side hooks help to provide support and attachment during assembly, and depending on the design may be sufficient to create an assembled structure. However, additional mechanisms (e.g., a stabilizer, or interlocking pieces, discussed below) may be used for permanent and stronger assembly.

Side hooks can help during manual assembly. However, side hooks are not used in some implementations. For example, side hooks can be omitted if robotic assembly is used and if, during the robotic assembly, the base plate containing array structures is not flipped over to insert the stabilizer.

The geometry of the array structure is such that it cannot be inserted all the way through the base plate. As shown in FIG. 4B, this is achieved by making a part 404 of the array structure wider than the openings in the base plate. In order to facilitate the insertion of the array structure into the base plate, and to protect the side hooks (e.g. 411) from possible damage in the case of misaligned insertion, the inserted array structures return to their original width 421 and are slowly narrowed down in a tapered section at the bottom 423.

Additional stability can be achieved by inserting a stabilizer 301 through the array structures (e.g., 101). This requires the array structures to have holes (sometimes referred to herein as "stabilization holes"), through which the prongs of the stabilizer may be inserted. An example of an assembled structure is shown in FIGS. 5A, 5B. Different stabilizer designs are shown in FIGS. 3, 6A-6E, comprising solid fingers for mechanical stability and guidance during insertion, and hook fingers for the attachment. The hook fingers 303, 305 comprise cantilevers with hooks at the end (e.g., 511, 513 in FIG. 5A), that snap into place when inserted through the array structures. The cantilevers can be of a very specific length to achieve the desired degree of flexibility, which means that at some point along the hook finger, the cantilever may end and the finger becomes solid (e.g. at points 311, 313 in FIG. 3).

FIG. 1 shows a side view of an array structure. The array structure is flat, and comprises a row of about 15 individual probes 103. The number of individual probes in an array structure may vary. Each of the individual probes (e.g., probe 105) includes multiple electrodes, located at different points along the shaft and tip of the probe. Each individual probe can be located at an arbitrary distance to its neighbors (not necessarily uniform spacing as shown in FIG. 1), and each individual probe can also have different overall geometry (e.g. length, width, and wiring geometry). The array structure includes two male portions 107, 109, which are configured for insertion into a base plate 201 (shown in FIG. 2).

Male portion 107 includes two side hooks 111, 112 and male portion 109 includes two side hooks 113, 114. Each of the side hooks 111, 112, 113, 114, respectively, is configured for snapping into place over the base plate, when the male portion is inserted into the base plate.

In the example shown in FIG. 1, the array structure has four stabilization holes 115, 117, 119, 121. There are two stabilization holes in each male portion (e.g., stabilization holes 115 and 117 in male portion 107).

Figure 2:
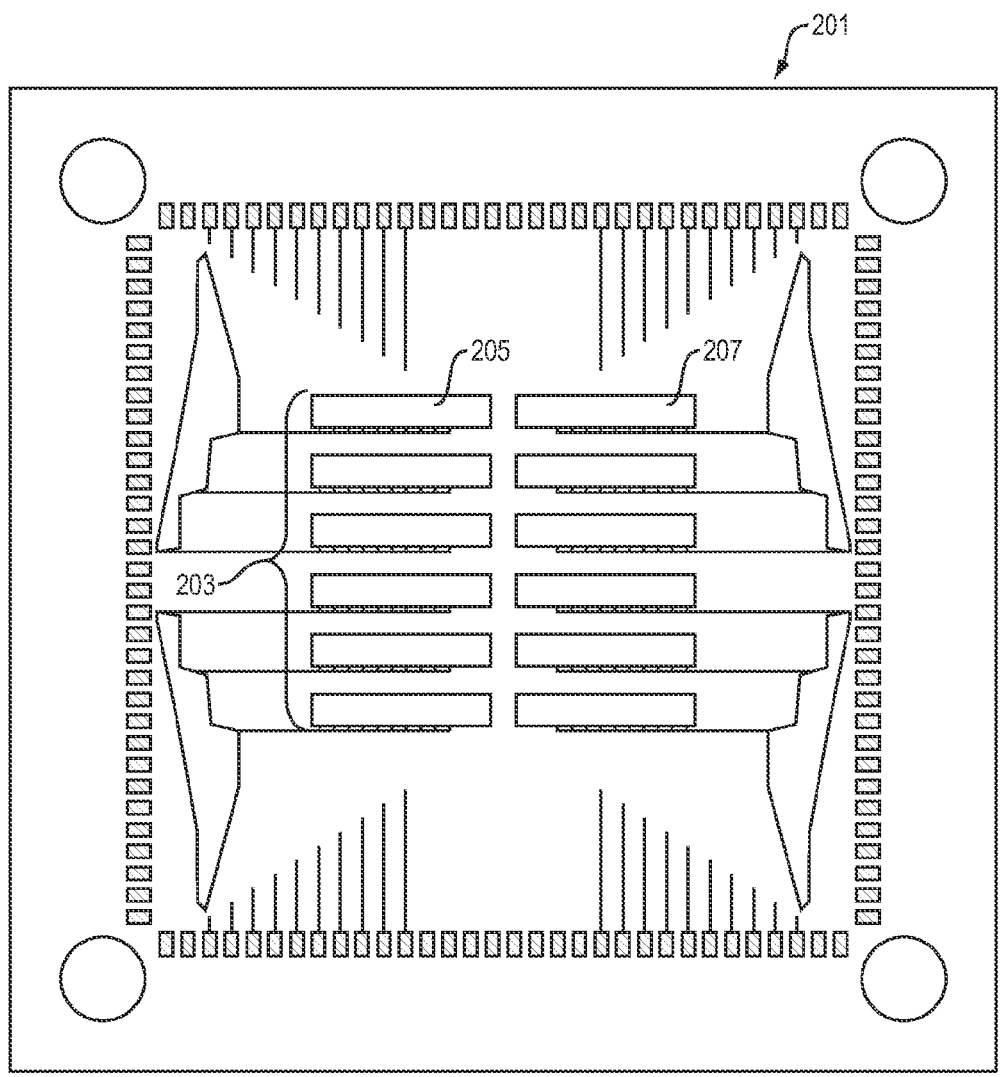
FIG. 2 shows a bottom view of a base plate.

FIG. 2 shows a bottom view of a base plate 201. The base plate has six rows of slots 203. Each row comprises two slots (e.g., 205, 207). In the example shown in FIGS. 1-3, the two male portions (e.g., 107, 109) of an array structure are configured to be inserted into the two slots (e.g., 205, 207) in a row in the base plate 201. When the array structure is inserted into the base plate, it is orthogonal to the base plate. This invention is not limited to the configuration shown in FIG. 2: connections can be made on either the top or bottom, or both. The final choice depends on the overall system design. In the example shown in FIG. 2, the bottom side is used, because of the way the base plate will be attached to a circuit board (to allow the needles of the array structures to face away from the circuit board).

Figure 3:
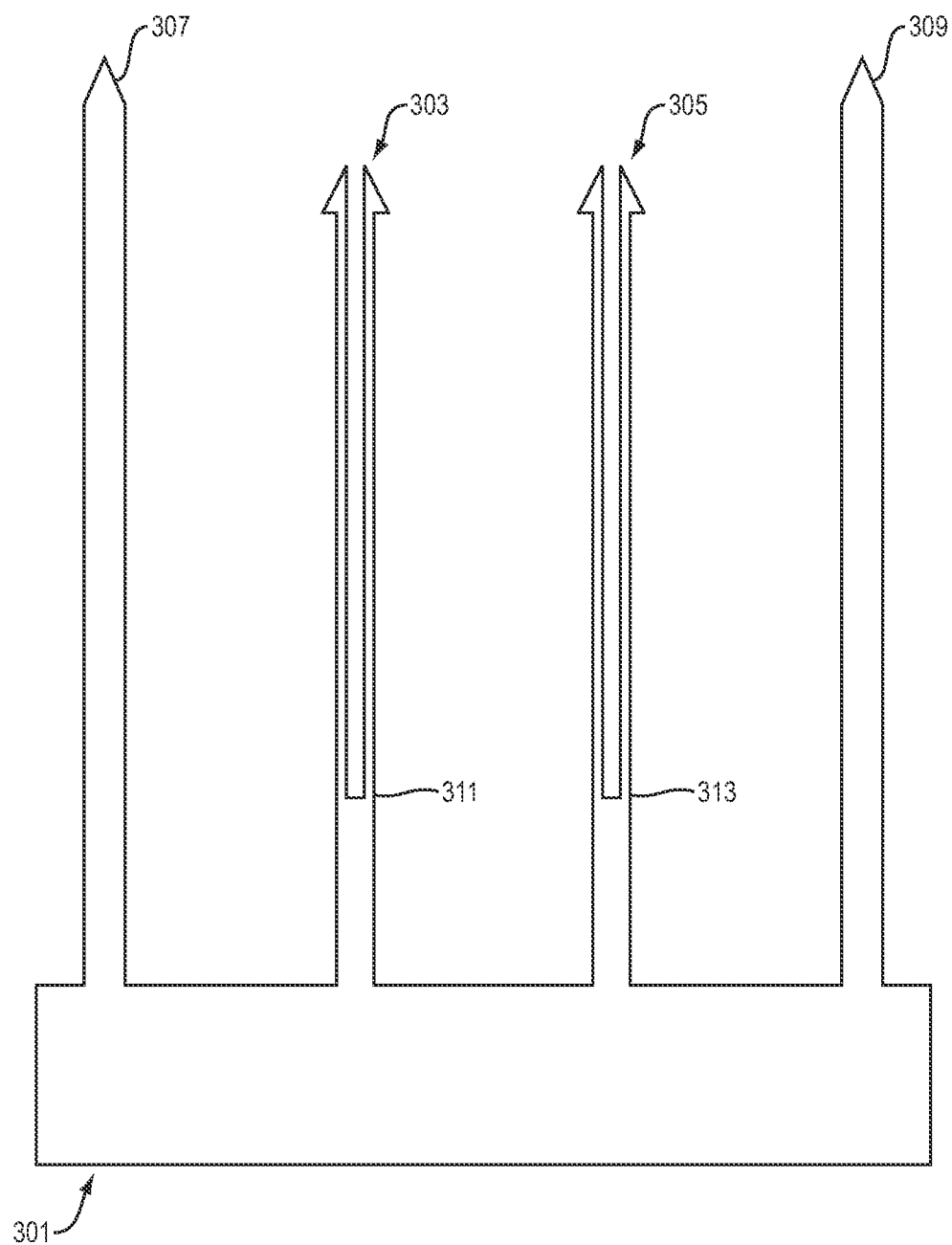
FIG. 3 shows a stabilizer comprising two inner prongs with hooks and two outer prongs without hooks.

FIG. 3 shows a stabilizer 301 that comprises two inner prongs 303, 305 with hooks and two outer prongs 307, 309 without hooks. In the example shown in FIGS. 1-3, the four prongs 303, 305, 307, 309 of the stabilizer 301 are configured for insertion into the four stabilization holes 115, 117, 119, 121 of the array structure 101. When the array structures and stabilizer are inserted into the base plate and stabilization holes, respectively: (1) the base plate 201 is parallel to the plane in which the prongs of the stabilizer 301 lie; and the array structures (e.g., 101) are orthogonal to the base plate 201 and to the plane in which the prongs of the stabilizer 301 lie.

Figure 4A:
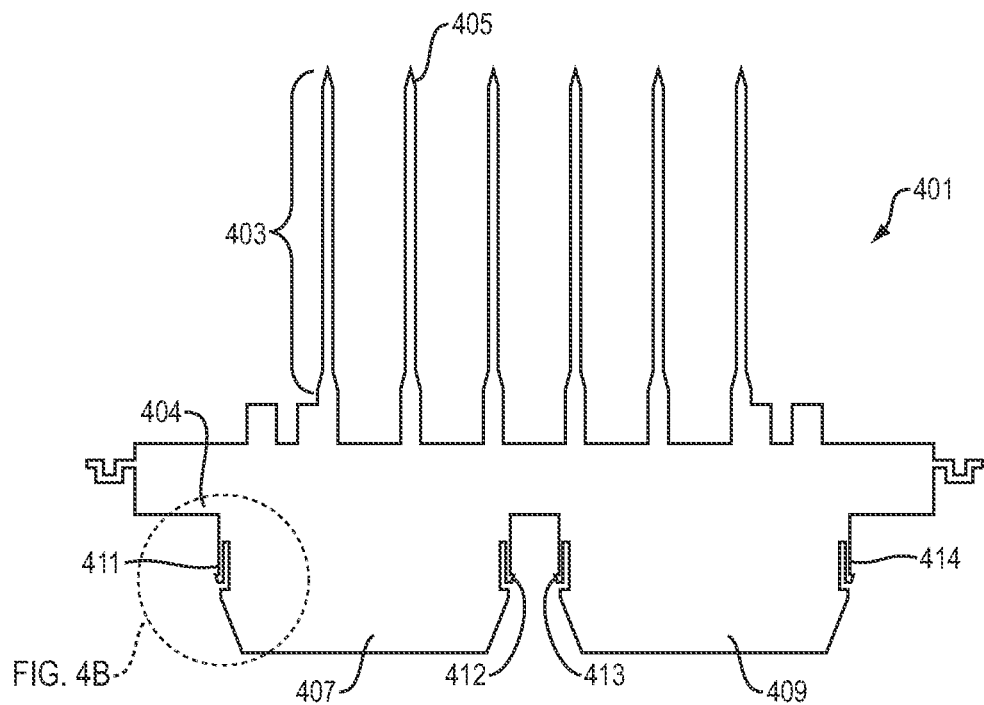
FIG. 4A shows a side view of an array structure.
Figure 4B:
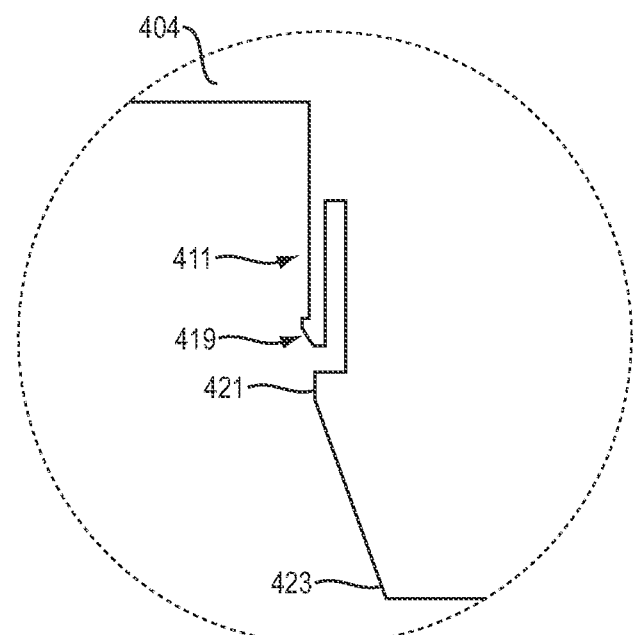
FIG. 4B shows an enlarged view of part of the array structure.
Figure 5A:
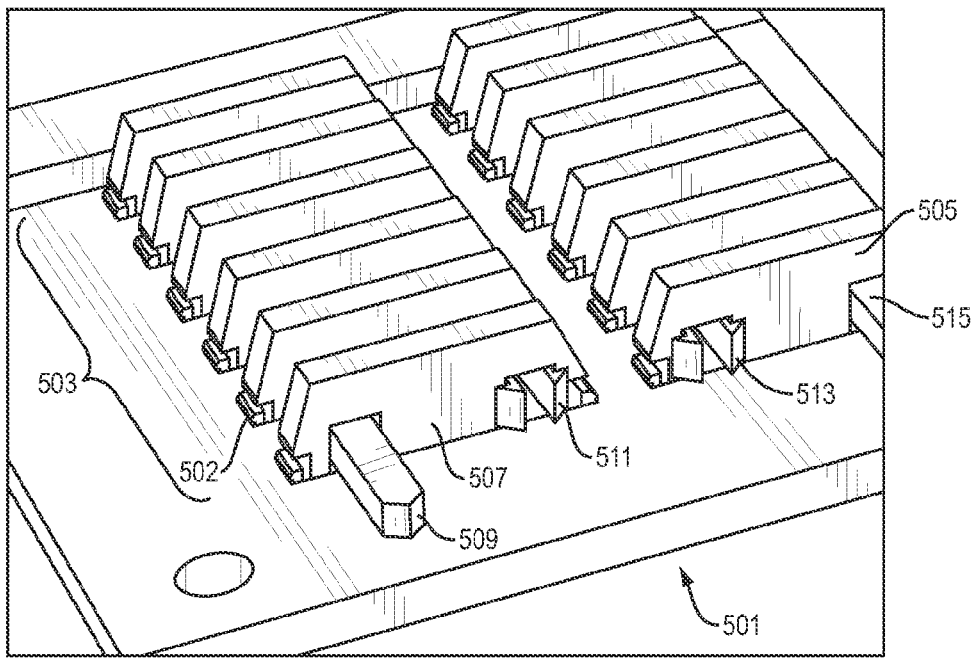
FIG. 5A shows a perspective view of a base plate.
Figure 5B:
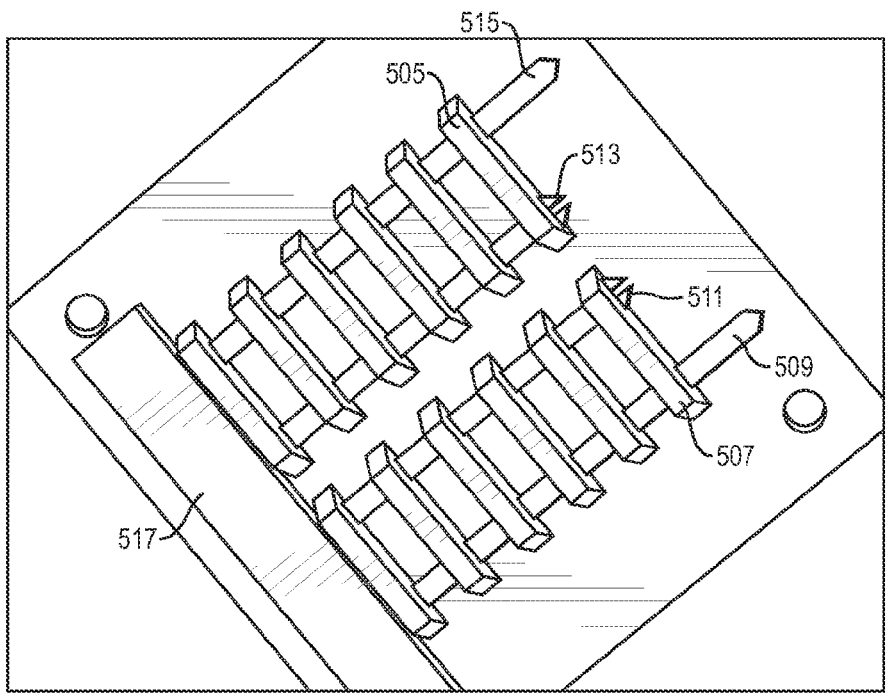
FIG. 5B shows a bottom view of the same base plate.

FIG. 4A shows a side view of an array structure 401. In the example shown in FIG. 4A, the array structure 401 comprises a row 403 of six individual probes (e.g., individual probe 405). The array structure has two male portions 407, 409 and four side hooks 411, 412, 413, 414.

FIG. 4B shows an enlarged view of part of FIG. 4A. Side hook 411 includes a hook tip 419.

FIG. 5A shows a perspective view of the bottom of a base plate 501. Twelve male portions 503 of six array structures protrude through the base plate 501. For example, male portions 505, 507 of a single array structure protrude through the base plate 501. Four prongs 509, 511, 513, 515 of a stabilizer 517 have been inserted through stabilization holes in 12 male portions, holding in place a set of six array structures. The tips of small side hooks in the array structures are seen at the periphery (e.g., 502). The tips of the hooks of the stabilizer 511, 513 ensure irreversible attachment.

FIG. 5B shows a bottom view of the same base plate 501.

Figure 5C:
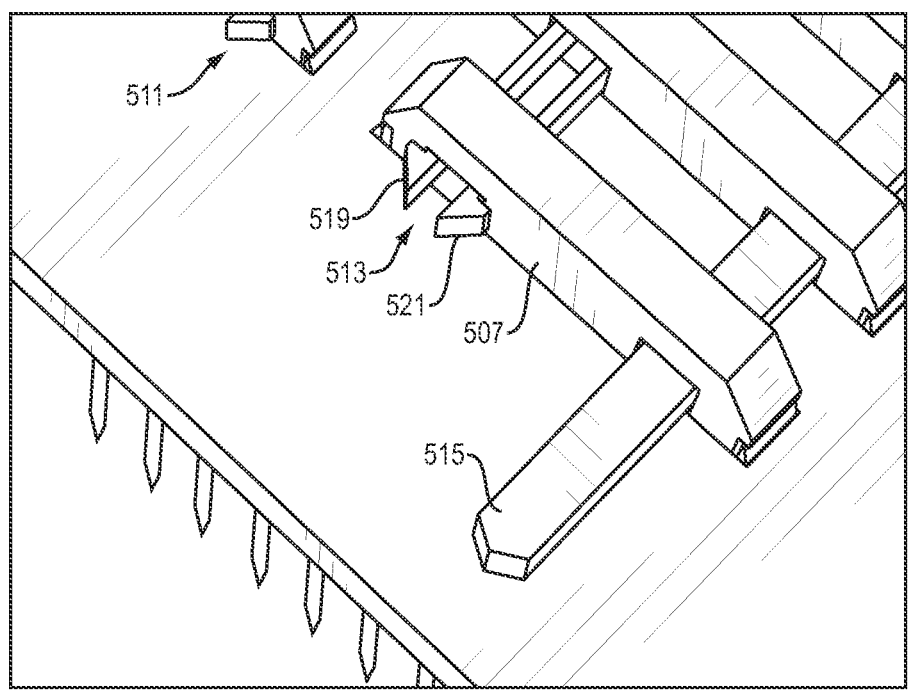
FIG. 5C shows a perspective view of part of the bottom of the same base plate.

FIG. 5C shows a perspective view of part of the bottom of the same base plate 501. As shown in FIG. 5C, the tip of prong 513 comprises two hooks 519, 521.

The number, type and position of prongs of a stabilizer may vary, depending on the particular implementation of this invention. Solid fingers (e.g., 307, 309) allow for stability, while hook fingers (e.g., 303, 305) provide irreversible attachment. Often, it is beneficial to have solid fingers on the outside, to protect the more fragile hook fingers. In addition, by designing solid fingers somewhat longer than the hook fingers, they can serve as guidance during the insertion to ensure that the hooks are inserted straight, thereby reducing the risk of damage to the hooks. In a prototype of this invention, the 4-finger design shown in FIG. 3 is used. The hooks may transition from their set of beams to a solid structure (e.g. at points 311, 313) so that the desired degree of hook strength and flexibility is achieved.

FIGS. 3 and 6A-6E show some examples of prong arrangements for a stabilizer.

FIG. 6A shows a stabilizer 601 comprising two outer prongs 603, 605 with hooks and two inner prongs 607, 609 without hooks.

FIG. 6B shows a stabilizer 611 comprising four prongs 613, 615, 617, 619 with hooks.

FIG. 6C shows a stabilizer 621 comprising two outer prongs 623, 625 with hooks and one inner prong 627 without hooks.

FIG. 6D shows a stabilizer 631 comprising two outer prongs 633, 635 without hooks and one inner prong 637 with hooks.

FIG. 6E shows a stabilizer 641 comprising two outer prongs 643, 645 with hooks and one inner prong 647 without hooks. FIG. 6E is similar to FIG. 6C, except that the spacing (pitch) between the prongs is greater than in FIG. 6C.

Figure 8A:
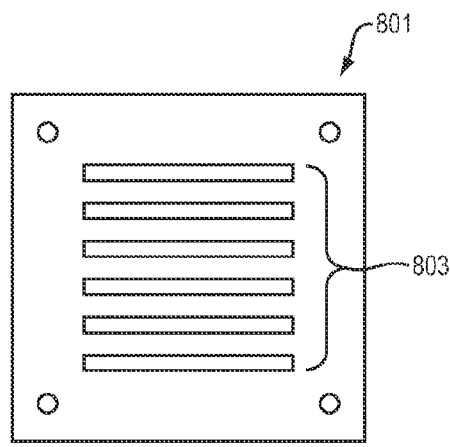
FIG. 8A shows a base plate with six slots, into which six array structures can be inserted. In this case, each of the array structures would have only one male portion.
Figure 8B:
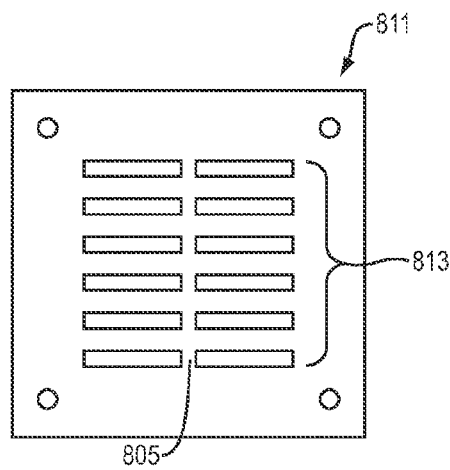
FIG. 8B shows a base plate with twelve slots, into which six array structures can be inserted. In this case, each of the array structures would have two male portions.
Figure 8C:
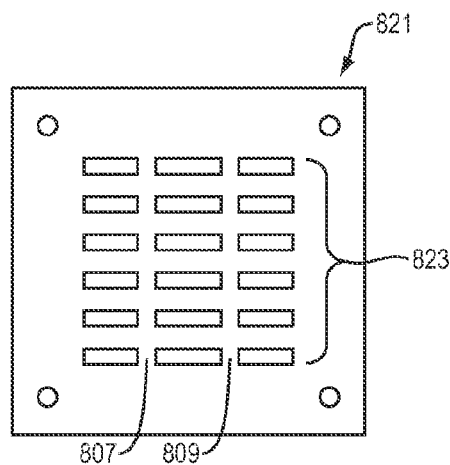
FIG. 8C shows a base plate with eighteen slots, into which six array structures can be inserted. In this case, each of the array structures would have three male portions.

The base plate can be designed in a variety of styles, including those styles shown in FIGS. 8A-8C. In order to create better stability, the opening can be interrupted by bridge sections (e.g., 805, 807, 809 in FIGS. 8B, 8C). Spaces (e.g. 731, 733, 735) for these bridges will have to be also designed into the array structures that are inserted into the base plate 2. Generally, increasing the number of bridges increases stability and also provides more side hooks (as seen in FIG. 4A). However, each increase will reduce the utilizable area on the male portions of the array structures, and also decreases the space available for side hook insertion. Therefore, as a practical compromise in this tradeoff, a single bridge is employed in some implementations (e.g., bridge 805 in FIG. 8B). Further, the base plate may contain holes to allow it to be attached (and precisely aligned) to larger systems or packages (for example by attaching it to a printed circuit board using small screws).

Openings are cut out at regular or arbitrary spacing. Typically, if a stabilizer 301 is used, then parallel alignment of the cutouts is needed. For example, parallel alignment of cutouts may be needed if a stabilizer is used and the stabilization holes are sized to exactly fit an orthogonally inserted prong of a stabilizer. Alternately, non-parallel cutout could be used even with a stabilizer if the array structures have stabilization holes that are appropriately situated and sized to accommodate the stabilizers. For example, an array structure inserted at a non-orthogonal angle to the stabilizer may require wider stabilizer holes to accommodate the non-orthogonal insertion of the stabilizer through the array structure. If a stabilizer 301 is not used, the openings can be arranged at any rotation between each of them. Side hooks (e.g., 411, 412, 412, 414) do not require parallel alignment of the openings, because the side hooks for any particular array structure apply only to the cutout through which that particular array structure is inserted.

In exemplary implementations of this invention, the number and position of male portions on a single array structure may vary. Likewise, the number and position of slots in a base plate may vary (depending on the number of position of the male portions of the array structures that will be inserted into the slots). FIGS. 7A-8C illustrate some examples.

Figure 7A:
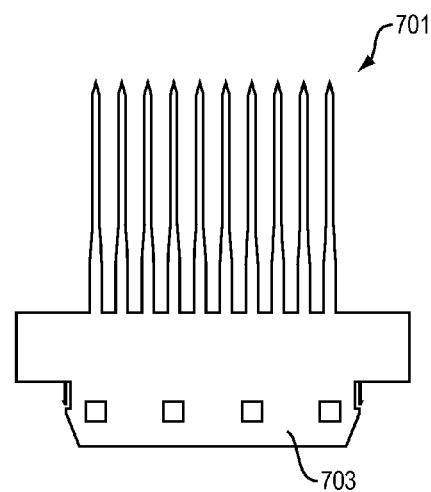
FIG. 7A shows an array structure that has only one male portion.
Figure 7B:
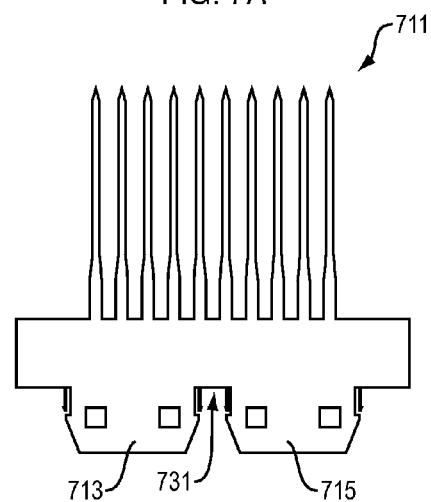
FIG. 7B shows an array structure that has two male portions.
Figure 7C:
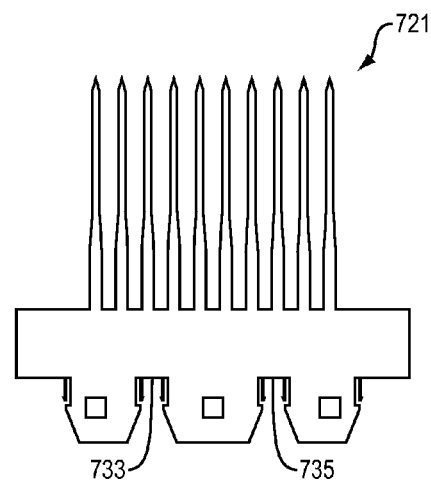
FIG. 7C shows an array structure that has three male portions.

FIGS. 8A -8C show different base plate designs. FIGS. 7A-7C show different array structure designs for zero, one and two bridges per slot. Increasing the number of bridges helps increase stability, yet usable area on the array structure is also decreased due to the required cutting out of the bridge areas.

FIG. 7A shows an array structure 701 that has only one male portion 703.

FIG. 7B shows an array structure 711 that has two male portions 713, 715.

FIG. 7C shows an array structure 721 that has three male portions.

FIG. 8A shows a base plate 801 with six slots 803, into which six array structures can be inserted. In this case, each of the array structures would have only one male portion (as shown in FIG. 7A). Each slot would have zero bridges.

FIG. 8B shows a base plate 811 with twelve slots 813, into which six array structures can be inserted. In this case, each of the array structures has two male portions (as shown in FIG. 7B). Each slot has one bridge.

FIG. 8C shows a base plate 821 with eighteen slots 823, into which six array structures can be inserted. In this case, each of the array structures has three male portions (as shown in FIG. 7C). Each slot has two bridges.

In exemplary implementations of this invention, a purely mechanical assembly is not sufficient. Electrical connections are also needed between the orthogonal base plate and the inserted array structures. This is a challenging problem, as conventional microfabrication cannot take place on a 3-D structure.

In exemplary implementations of this invention, this problem is solved by electroplating across the gap between the two orthogonal structures. This electroplating allows high density connections (i.e., numerous electrical connections with a small pitch between electrical connections). A conductive pad is electroplated until it makes contact with a second conductive pad, resulting in a smooth and continuous surface shortly thereafter.

Figure 9A:
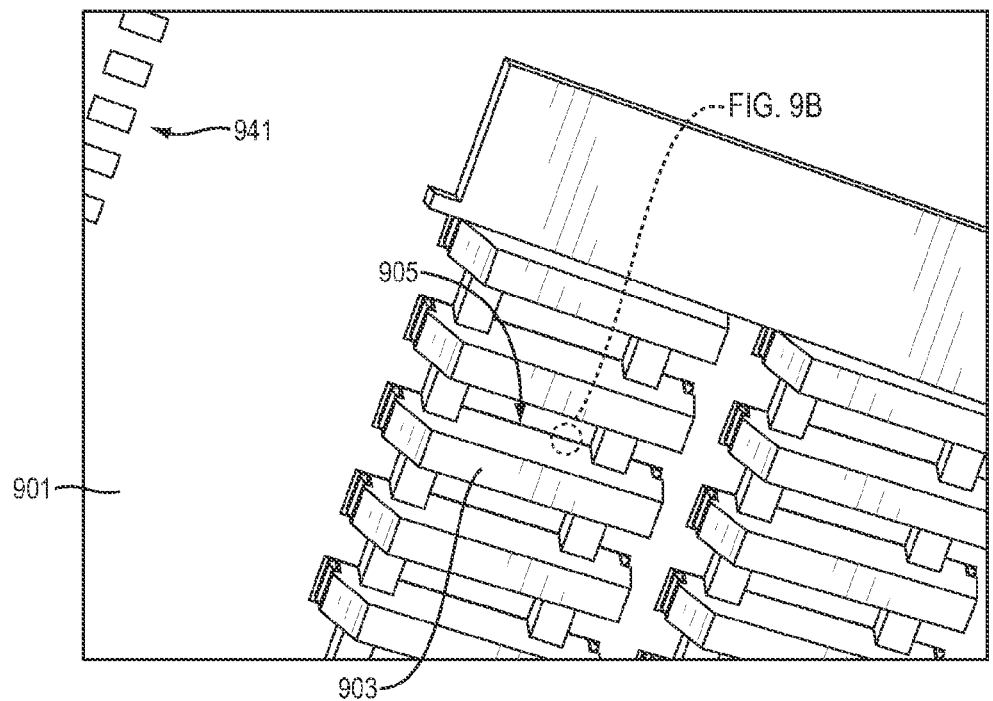
FIG. 9A shows a bottom of a base plate with array structures protruding through it.

FIG. 9A shows a view of a bottom of a base plate 901 and male portions (e.g., 903) of array structures that have been inserted into, and protrude beyond, the base plate 901. A slight gap 905 exists between the array structure 903 and the base plate 901.

Figure 9B:
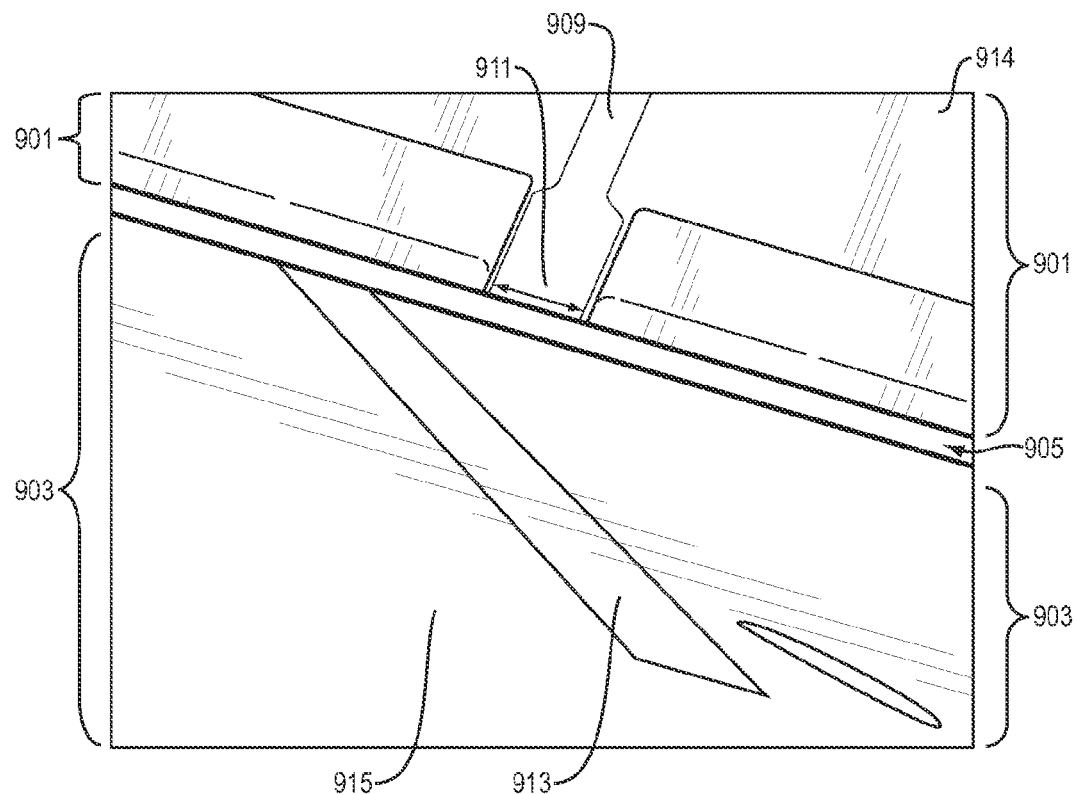
FIG. 9B shows an enlarged view of part of FIG. 9A.

FIG. 9B shows an enlarged view of part of FIG. 9A. FIG. 9B shows a gap 905 between an array structure 903 and the base plate 901. In the example shown in FIG. 9B, the gap 905 is approximately 20 micrometers. On the base plate 901, a bare conductive pad 911 is partially surrounded by a dielectric material 914. Likewise, on the array structure 903, a bare conductive pad 913 is partially surrounded by a dielectric material 915. In regions (e.g., 914, 915) near the pads 911, 913, the base plate and array structure are electrically insulated by common dielectric materials such as silicon dioxide or nitride. Metal wiring 909 can be used to route the pads on the base plate 901 (for example to larger, external pads 941—although the base plate or any of the array structures may also contain integrated circuits).

To facilitate the electroplating process, pads on both structures (base plate, and inserted array structure), may be electroplated to form "bumps", so that the final plating step is achieved more quickly. This creates better process control, and also allows for tighter pad pitch.

Figure 10A:
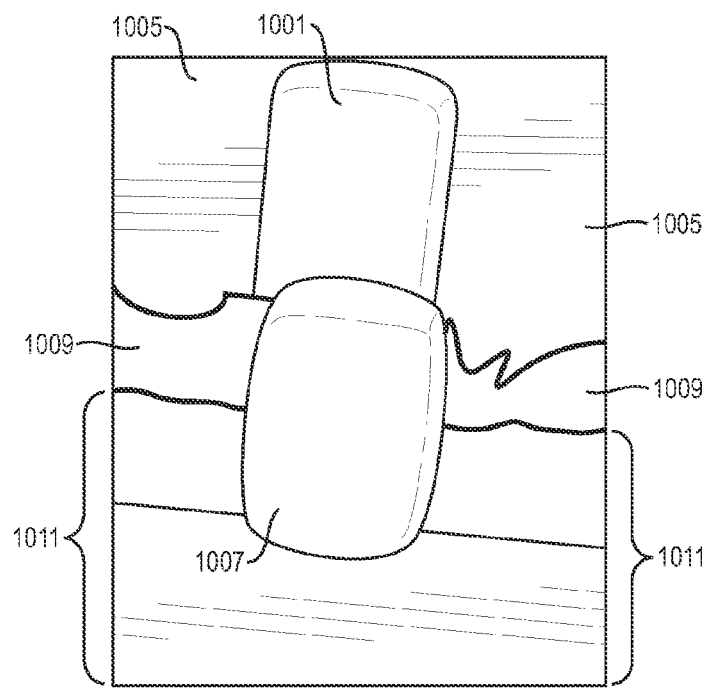
FIG. 10A shows bumps.
Figure 10B:
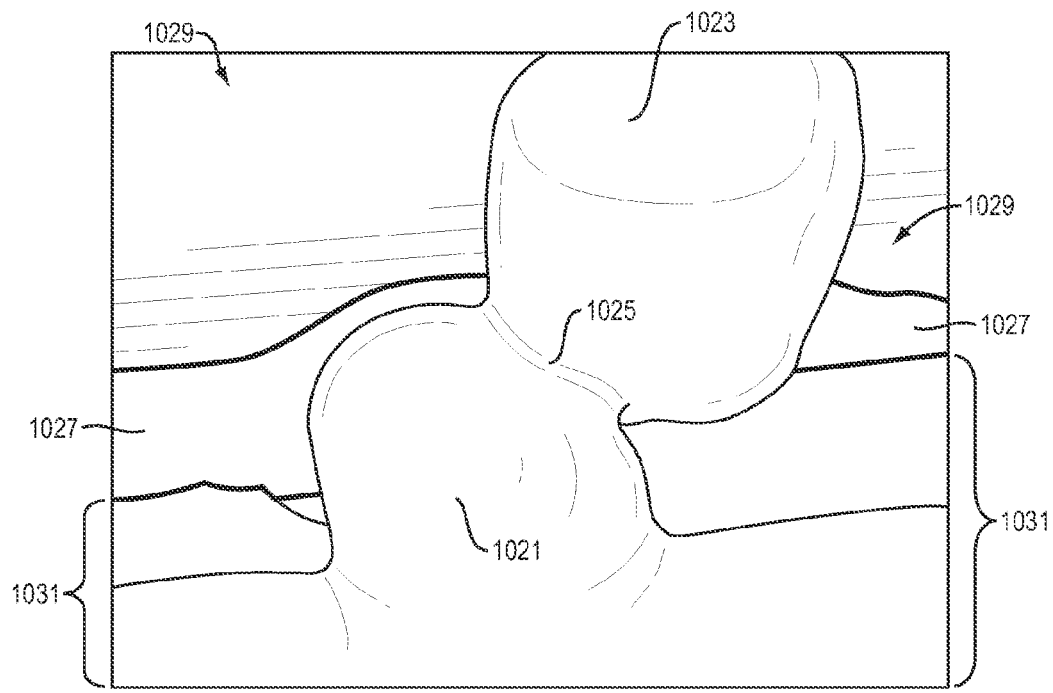
FIG. 10B shows an electrical connection that joins the two bumps.

FIGS. 10A and 10B show how an electrical connection may be established between two pads. The pads were previously plated separately as a preparatory step, while the base plate and array structure were not adjacent to each other. This preparatory plating was done to build up "bumps" and bring the pads closer into contact for the final plating step.

In the example shown in FIG. 10A, pad 1001 on an array structure 1005 was built up into a bump in a preparatory plating step. Separately, pad 1007 of a base plate 1011 was built up into a bump in another preparatory plating step. In FIG. 10A, the two bumps are not yet connected, but are still separated by gap 1009.

In the example shown in FIG. 10B, additional conductive material has been added in a final plating step, creating an electrical connection 1025 two bumps 1021, 1023. Electrical connection 1025 spans a gap 1027 between a male portion 1029 of an array structure and a base plate 1031. In the example shown in FIG. 10B, the edges of the male portion and base plate have some misalignment, as visible in the horizontal offset between bump 1021 and bump 1023. An electrical connection is nonetheless still established.

In exemplary implements of this invention, a high density of electrical connections may be formed. For example: (a) the pitch of the electrical connections may be less than 50 micrometers; (b) the pitch of the electrical connections may be less than 40 micrometers; or (c) the pitch of the electrical connections may be less than 30 micrometers.

Figure 11:
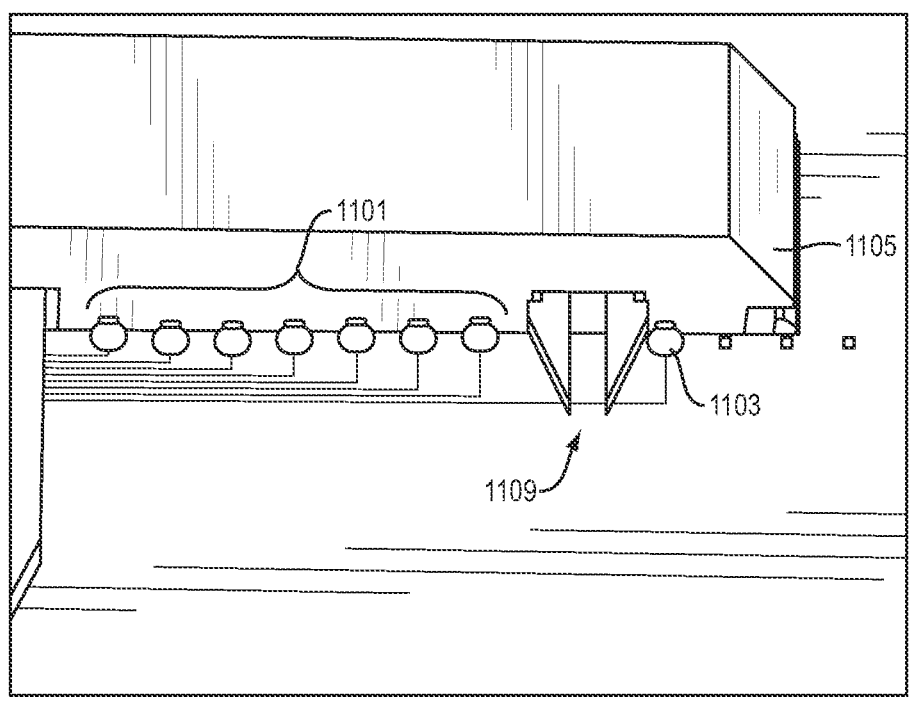
FIG. 11 shows electrical connections between an array structure and a base plate.

In the example shown FIG. 11, numerous electrical connections 1101, 1103 have been electroplated between an array structure 1105 and a base plate. FIG. 11 also shows a hooked prong 1109 of a stabilizer that has been inserted through a stabilization hole in the array structure 1105.

The specific metal used in the electroplating may vary, and common plating metals such as copper, nickel, or gold may be used. Furthermore, this invention is not limited to electroplating but includes other forms of deposition. For example, electroless deposition may be used for making the connection and the bumps.

For electroplating, components which are electroplated need to be electrically connected to a power supply. Thus, it is desirable that all of the pads and locations on which plating takes place should be short-circuited together and routed out of the plating chemical bath.

In some implementations of this invention (e.g., in which the base plate contains integrated circuitry), a thin seed layer is deposited onto the base plate, and subsequently masked so that plating only takes place in desired locations rather than everywhere (e.g. only pads 911, 913 in FIG. 9B). A drawback is that this method requires the removal of the mask and seed after plating is completed.

For applications where a seed layer cannot be used (due to material incompatibility with the corrosive chemicals needed to achieve the etching), an alternative approach may be employed. This alternative approach is illustrated in FIG. 12B, and can be used for base plates that do not contain integrated circuitry. In this alternative approach, all metal locations are short-circuited together at the periphery of the base plate, along multiple thin (and thus fragile) bridges (e.g., 1211, 1213). After electroplating, the short-circuit is removed by mechanically and irreversibly breaking these bridges (e.g., 1211, 1213), separating the connection between all the individual metal lines.

Figure 12A:
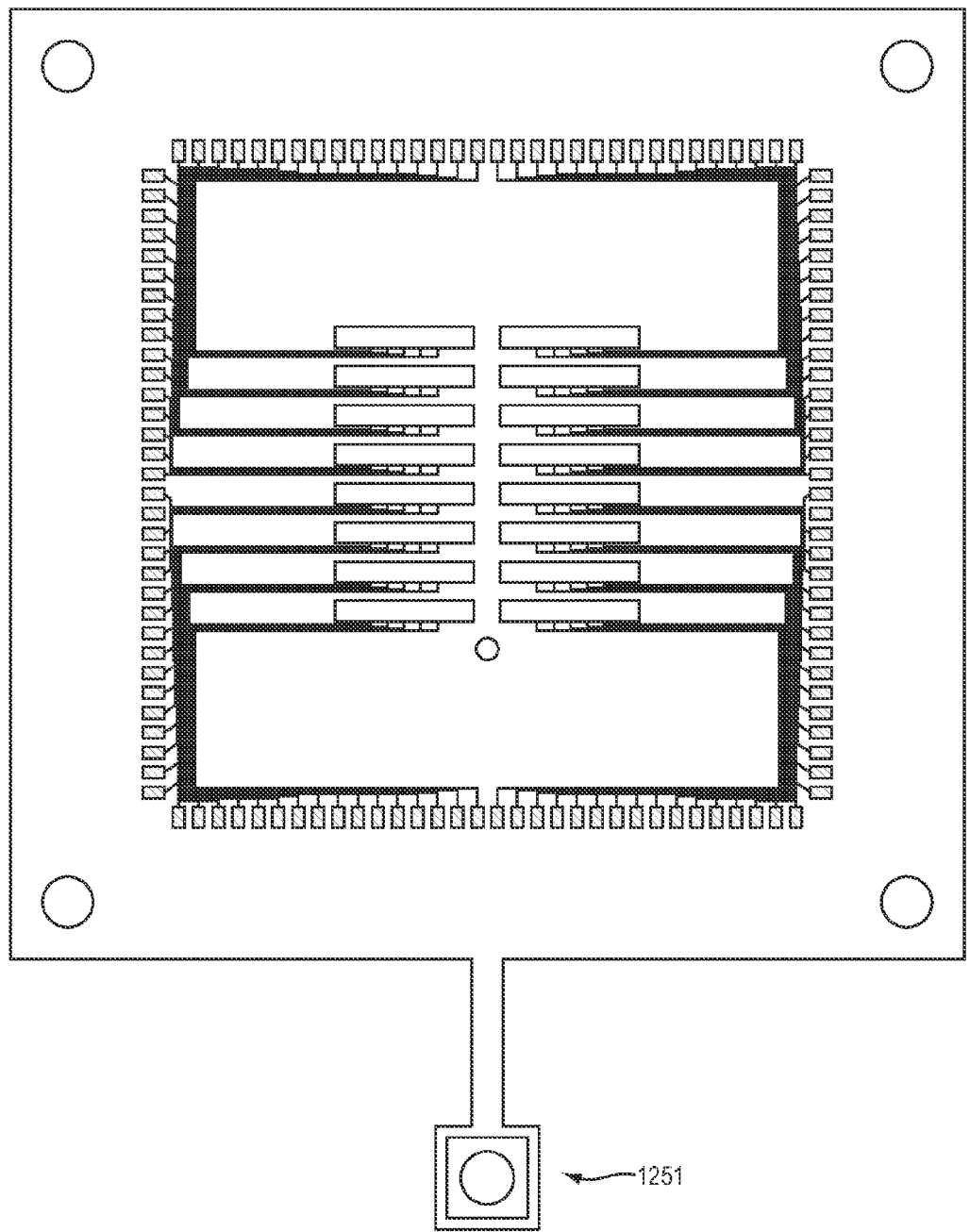
FIG. 12A is a diagram showing wiring for electroplating with use of a seed layer.
Figure 12B:
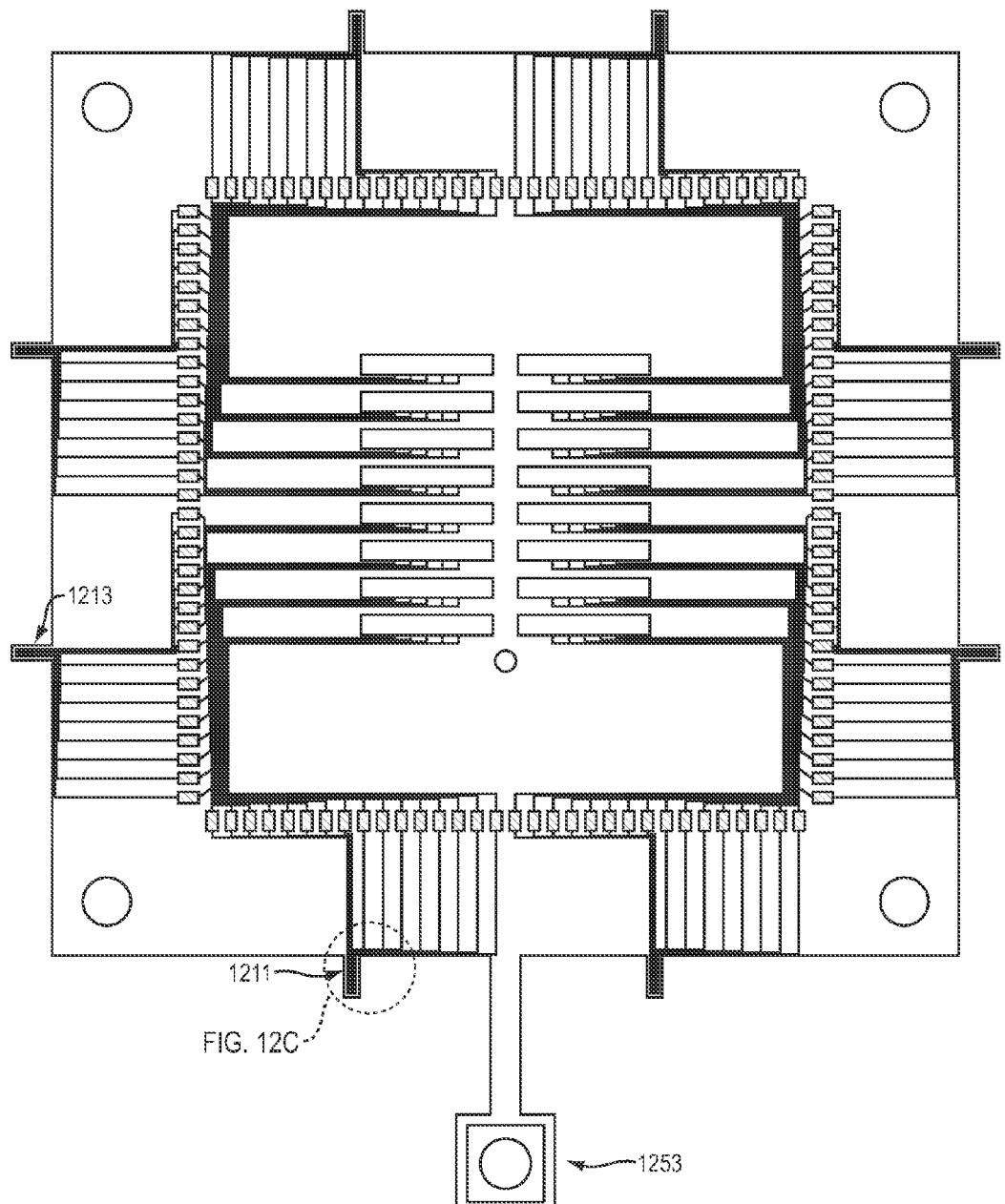
FIG. 12B is a diagram showing wiring for electroplating without a seed layer. All paths are short-circuited together at the periphery of the base plate.

FIG. 12A is a diagram showing wiring for electroplating with use of a seed layer.

FIG. 12B is a diagram showing wiring for electroplating without a seed layer. In this seed-less approach, all electrical paths are short-circuited together at the periphery of the base plate. These short circuits can be removed by physically breaking the bridges (e.g., 1211, 1213) at the periphery.

Figure 12C:
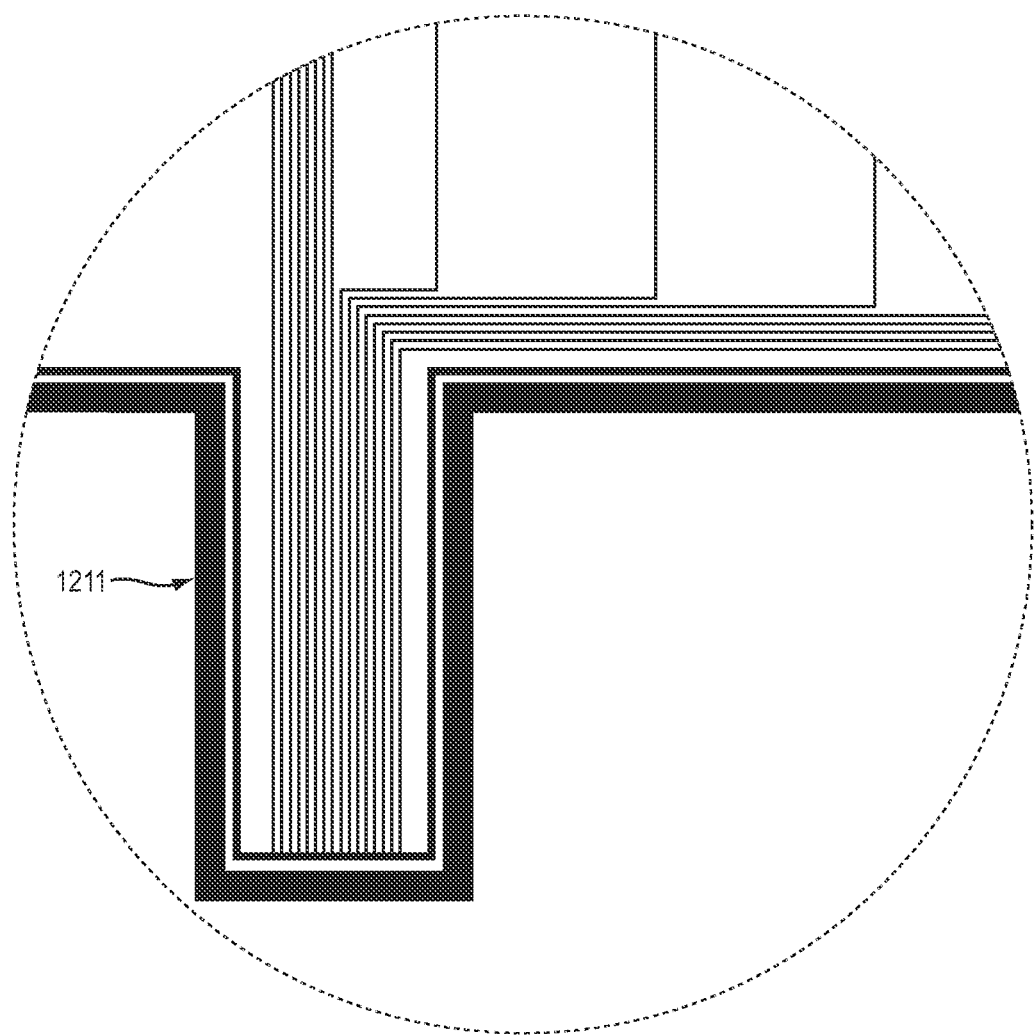
FIG. 12C is a diagram showing detail of part of FIG. 12B.

FIG. 12C is a diagram showing detail of part of FIG. 12B. In FIG. 12C, a short circuit is created in a tab 1211 on the periphery of the base plate. This tab 1211 make be broken off, after electroplating, in order to remove the short circuit.

In both the seeded and seed-less approaches, a plating contact (1251 in FIG. 12A, 1253 in FIG. 12B, 1255 in FIG. 12D) can be used to connect to the plating power supply during electroplating. It serves the purpose of providing a large contact area to which the plating power supply can easily be attached (e.g., by a crocodile clip). The plating contact (e.g., 1251, 1253, 1255) is removed by mechanical breaking once plating is complete.

Figure 12D:
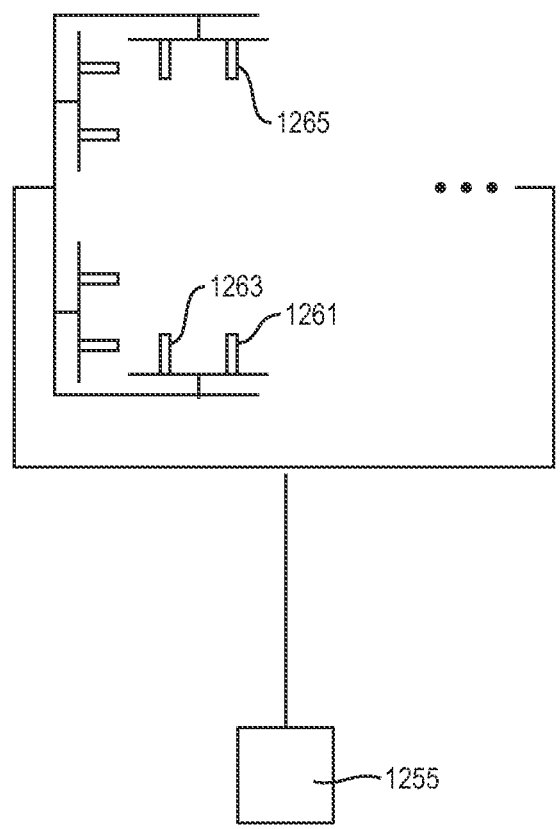
FIG. 12D shows a tree-like routing path at the periphery of a base plate.

FIG. 12D shows an alternate implementation, in which a tree-like routing path at the periphery of the base plate ensures that all bridges (e.g. 1261, 1263, 1265) are connected to the plating contact 1255 by the same path length—so that the voltage drop from plating contact 1255 to each of the bridges (e.g., 1261, 1263, 1265) is identical for each of the bridges. This may require multiple metal traces running around the periphery of each of the bridges (e.g., 1261, 1263, 1265). This is different than bridge 1211 shown in FIGS. 12B, 12C, where only a single metal line runs around the periphery of bridge 1211.

Figure 13:
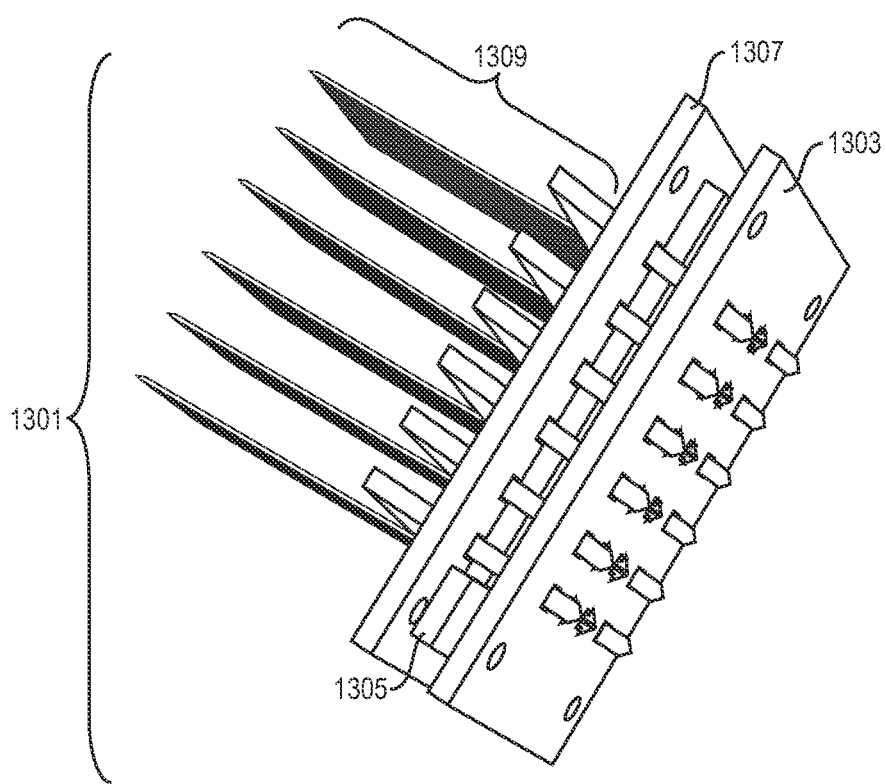
FIG. 13 shows the use of back plate.

In some cases, it may be beneficial to attach a back plate 1303 in parallel to the base plate 1307, as shown in FIG. 13. The back plate can be used to attach additional circuitry, or may contain optical devices that can couple orthogonally up into the array structures. For example, a back plate may be used as a surface for mounting a light source, such as an LED or laser. The light source may shine light into optical channels that extend into the respective array structures. The light may be used for optical stimulation of tissue. Methods for fabricating such optical channels on array structures are discussed in "Methods and Apparatus for Microstructure Lightguides", Anthony Zorzos et. al., U.S. patent publication 2011/0087311 A1, publication date, Apr. 14, 2011, the entire disclosure of which is incorporated by reference herein.

Electrical connections can be made to the back plate from the orthogonal array structures, in the same manner as described above for the base plate.

In the example shown in FIG. 13, each array structure is inserted into both the back plate and the base plate. The array structures are attached to the base plate using side hooks, as described above. Additionally, the back-plate is inserted on bottom hooks 1501-1506 protruding from the bottom of the array structures. Some array structures inserts may contain solid fingers (1507, 1508) rather than bottom hooks, to provide an additional level of robustness and guidance when assembling the back-plate. This is similar to the solid fingers used for some of the stabilizer prongs, which are discussed above.

FIGS. 14A-15B show structural components that may be used to attach the back-plate. The array structures are modified to include bottom hooks and bottom solid fingers. The bottom hooks hold the back-plate in place. In addition, similar to the design of a stabilizer (FIG. 3), solid fingers on the bottom of the array structures may be used to guide assembly and make the bottom hooks less prone to damage.

FIG. 13 shows an example of use of a back plate. In FIG. 13, a 3D probe array 1301 comprises a back plate 1303, a stabilizer 1305, a base plate 1307, and array structures 1309. Each array structure contains one or more bottom hooks (e.g., 1501, 1502) and guide beams (e.g., 1507, 1508) for attaching the back-plate.

Figure 14A:
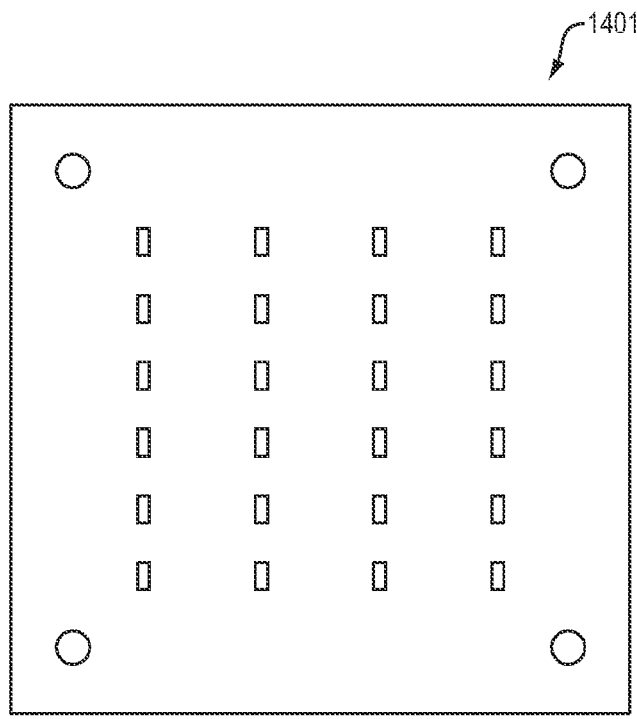
FIGS. 14A shows a back plate.
Figure 14B:
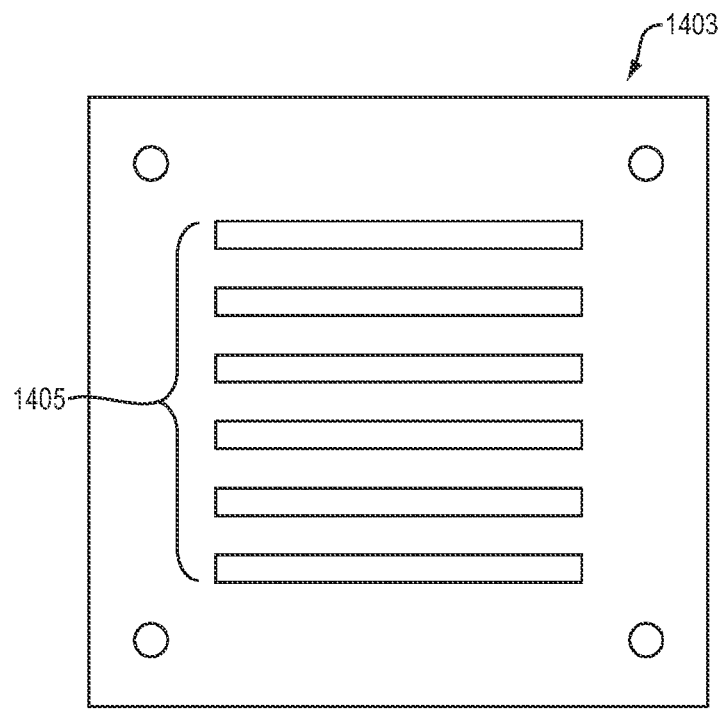
FIG. 14B shows a base plate.

FIGS. 14A and 14B show a back plate 1401 and a base plate 1403, respectively. In the example shown in FIGS. 14B, the base plate 1403 has six slots 1405 into which male portions of array structures can be inserted. FIG. 14A shows a back plate with six rows of four holes each. Hooks or guide prongs on the bottom of male portions of array structures can be inserted into these holes in the back plate.

Figure 15A:
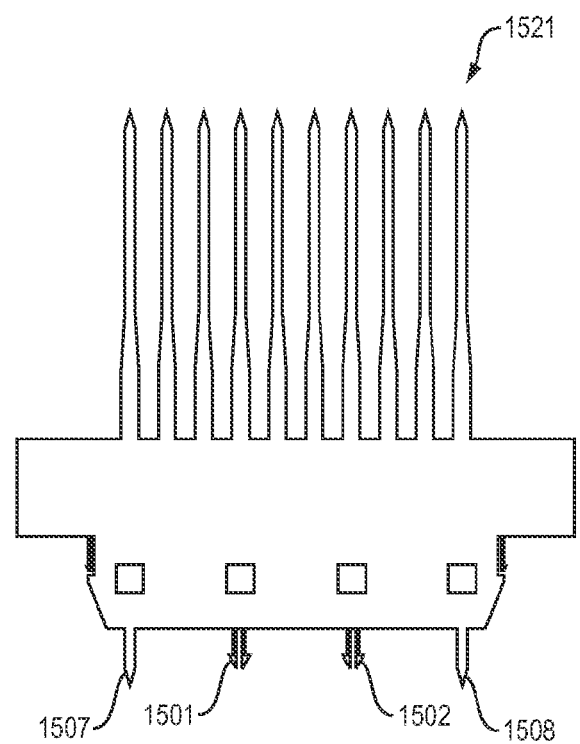
FIGS. 15A and 15B show different configurations of bottom prongs that may be inserted into a back plate.
Figure 15B:
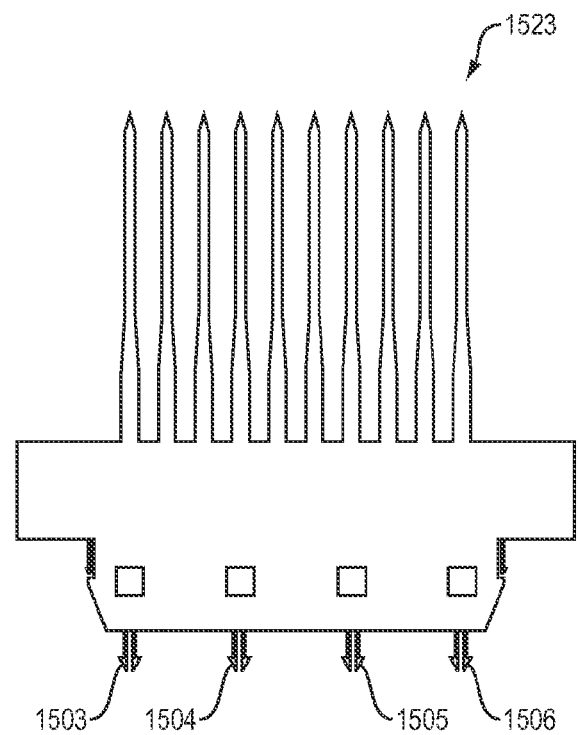

FIGS. 15A and 15B show different configurations of bottom prongs, at the bottom of an array structure, that may be inserted into a back plate. FIG. 15A shows two outer prongs 1507, 1506 that are solid guide beams and two inner prongs 1501, 1502 that have hooks. FIG. 15B shows four prongs 1503-1506, all of which are hooks.

In some cases, it may be desirable to have the base plate be as perfectly orthogonal to the inserted array structures, or to have all individual components aligned exactly in the same direction. The methods described above will have some rotation tolerance of the inserts, because the base plate openings will be slightly wider than the thickness of the inserted structures. To produce a better alignment, a back plate can help.

However, more accurate control is gained by creating a set of two identical alignment parts that can be attached to the 3D probe as shown in FIGS. 16A-18. Each alignment part comprises a base from which many fingers extend. Each finger contains many hooks. When two of these alignment parts are pushed together, they interlock to provide permanent attachment. Further, at their bases, the alignment parts have tapered sections that permit extremely tight fit and alignment of the array structures. A cutout (e.g., 1611, 1613) may be fabricated on each of the array structures. The alignment parts slide into the cutout, thereby preventing the alignment parts from moving in the vertical direction (they are already fixed from horizontal movements by their interlocking hooks).

FIG. 16A shows a side view of an array structure. The structure has been modified to have cutouts 1611, 1613. FIG. 16B shows a top view of two array structures 1641, 1643, held in place by two alignment parts 1621, 1623.

When inserted, the alignment parts are parallel to the base plate (and thus orthogonal to the array structures). As shown in FIG. 16A, each array structure is modified to have cutouts (e.g. 1611, 1613) at its edges into which the alignment parts (e.g., 1621, 1623) can slide when are inserted from the left and right toward the array structure. As shown in FIG. 16B, the indentations (e.g., 1631, 1633, 1635, 1637) on the alignment parts are tapered, and thus can slide into the cutouts (e.g., 1611, 1613) by some amount. FIG. 16B shows two array structures seen from above (1641, 1643) being held in place when one 1621 of the two alignment parts has been inserted. The alignment parts 1621, 1623 include beams with hooks 1651, 1653, 1655, 1657, 1677 that keep the array structures in place horizontally. Vertical locking is achieved by the cutouts and the presence of the base-plate.

When the separation between array structures (e.g., 1641, 1643) is too narrow to accommodate a finger pair with hooks (e.g., 1655, 1657, 1651, 1661), that pair can be omitted. Ultimately, if all separations are too narrow, fingers such as 1671, 1673 1675, 1677 may be situated outside the array structure region. These exterior fingers (1671, 1673, 1675, 1677) may be omitted if there is room in the array structure region for finger pairs with hooks.

FIG. 17 is a diagram showing how a series of V-shaped slots 1701, 1703, 1705 may be used to stabilize array structures 1707, 1709, 1711 that are inserted into it.

Figure 18:
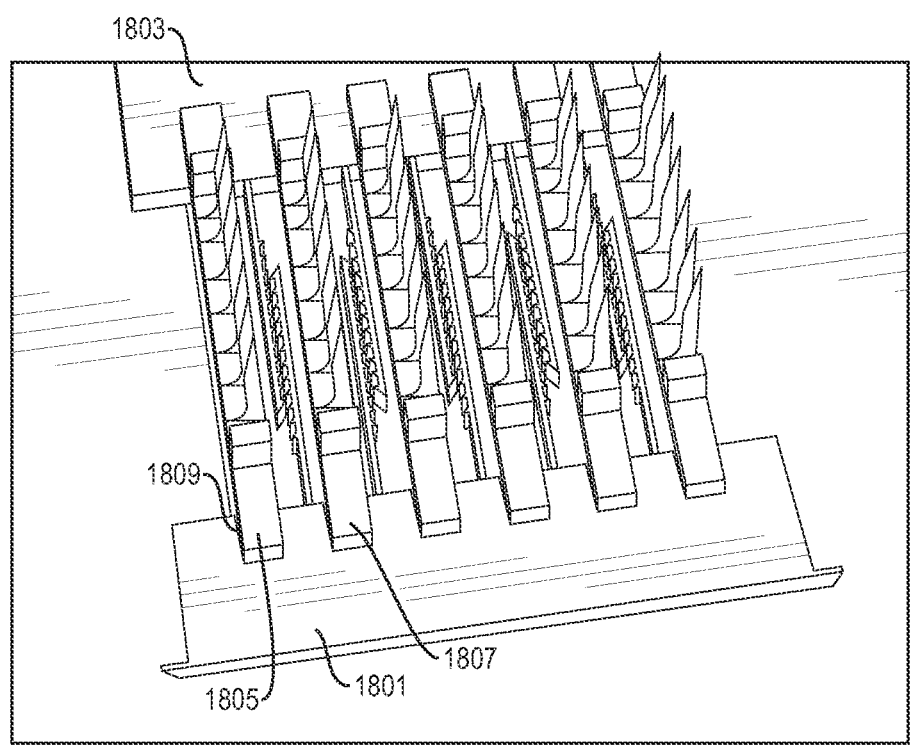
FIG. 18 is a perspective view of two alignment parts that are interlocked around array structures.

FIG. 18 is a perspective view of two alignment parts 1801, 1803 that are interlocked around array structures (e.g. 1805, 1807). The alignment parts have tapered indentations (e.g. 1809).

Definitions and Clarifications:

Here are a few definitions and clarifications. As used herein:

The terms "a" and "an", when modifying a noun, do not imply that only one of the noun exists.

The term "curve" includes a straight line or a curved line.

As used herein, the term "electrical deposition" includes electroplating and electroless deposition.

The fact that an "example" or multiple examples of something are given does not imply that they are the only instances of that thing. An example (or a group of examples) is merely a non-exhaustive and non-limiting illustration.

The term "fastener" shall be construed broadly. The term "fastener" includes any device that mechanically joins or affixes two or more objects together. A fastener may have a primary purpose other than joining or affixing. For example, hooks or barbs may comprise a fastener.

A "flat" object is an object that has an exterior surface that includes a first side and a second side. In a "flat" object, these first and second sides are (a) substantially planar and substantially parallel with each other and (b) comprise a majority of the exterior surface of the object. The exterior surface of a "flat" object may include other sides, in addition to the first and the second sides.

A "hole" may be of any shape, including a slit, slot or circle. A "hole" in an object may extend only partially into the object or may extend entirely through the object.

The terms "include", "includes" and "including" shall be construed broadly, as if followed by "without limitation". The term "e.g." means including.

A first surface and second surface are "off angle" with respect to each other if the first and second surfaces: (a) are each substantially planar; and (b) are not substantially parallel to each other.

The term "or" is an inclusive disjunctive. For example "A or B" is true if A is true, or B is true, or both A or B are true.

A parenthesis is simply to make text easier to read, by indicating a grouping of words. A parenthesis does not mean that the parenthetical material is optional or can be ignored.

A "planar surface" is a surface that lies in a plane. A "planar surface" may be of any shape, as long as it lies in a plane.

A "primary surface" of an object is a substantially planar surface that has a surface area that is larger than, or equal to, the surface area of each of the other substantially planar surfaces, if any, of the object.

A surface is "substantially planar" if all of the surface normal vectors that originate from points in the surface and extend out from one side of the surface are within 15 degrees of each other.

A first surface and second surface are "substantially parallel" to each other if: (a) the first and second surfaces are each substantially planar; (b) for a first region comprising at least a majority of the surface area of the first surface and a second region comprising at least a majority of the surface area of the second surface, each straight line, respectively, that intersects both the first and second regions forms a first angle between that line and the first region and a second angle between that line and the second region; and (c) for each of the lines, respectively, the absolute value of the difference between the number of degrees in the first angle and the number of degrees in the second angle is greater than or equal to zero and less than or equal to thirty. In order for the first and second surfaces to be "substantially parallel" to each other: (1) the condition set forth above in (b) and (c) of this definition does not need to be satisfied for all regions that comprise a majority of the surface area of the first and second surfaces, respectively; and (2) instead, the condition set forth above in (b) and (c) of this definition needs to be satisfied for at least one region that comprises at least a majority of the surface area of the first surface and for at least one region that comprises at least a majority of the surface area of the second surface.

The term "surface" means part of the exterior boundary of a physical object. For example, a region in a flat, rectangular, exterior side of an object, which region includes only part of the flat side and is bounded by a curve that lies in the plane of the flat side, is a "surface". A "surface" may have holes in it. In order for two points to be in the same "surface", however, it must be possible for the two points to be connected by a curve that lies entirely in the surface.

The term "V-shaped" shall be construed broadly. For example, a V-shaped slot may have any angle of taper. Or, for example, a V-shaped slot in an object may penetrate all of the way through the object, so that tapering sides of the V-shaped slot do not meet. Or, for example, a V-shaped slot in an object may penetrate only part way through the object, so that opposite tapering sides of the V-shaped slot meet within the object. Or, for example, a V-shaped slot may have a "V" that runs in any direction. For example, a "V" may taper (wider to narrower) from right to left or from up to down. Or, for example, a V-shaped slot may have tapering sides that define superimposed, multiple "V"s. For example, one V in a region of the slot may taper (wider to narrower) in one direction (e.g., left to right) and another superimposed V in the same region may taper (wider to narrower) in another direction (e.g., up to down)

Variations

This invention may be implemented in many different ways. Here are some non-limiting examples.

This invention may be implemented as a method comprising fabrication of at least one electrical connection between a first surface and a second surface by electrical deposition, wherein: (a) the first and second surfaces are separated, except for the at least one electrical connection, by a gap of not more than 100 micrometers; and (b) the first and second surfaces are off angle with respect to each other. Furthermore: (1) the electrical deposition may comprise electroplating; (2) the electrical deposition may comprise electroless deposition; (3) the at least one electrical connection may comprise multiple electrical connections, and the pitch between at least some of the multiple electrical connections may be less than 50 micrometers; (4) the pitch between at least some of the multiple electrical connections may be less than 40 micrometers; (5) the pitch between at least some of the multiple electrical connections may be less than 30 micrometers; and (6) the method may further comprise making a bump on the first surface, a bump on the second surface or a bump on both the first and second surfaces, respectively, by electrical deposition while the first and second surfaces are separated by a distance of more than 100 micrometers and before making the at least one electrical connection across the gap.

This invention may be implemented as an apparatus that includes one or more electrical connections, wherein each of the one or more electrical connections, respectively, is a product of electrical deposition and joins a first surface and a second surface, which first and second surfaces are off angle with respect to each other and are separated, except for the one or more electrical connections, by a gap of not more than 100 micrometers. Furthermore: (1) the electrical deposition may comprise electroplating; (2) the electrical deposition may comprise electroless deposition; (3) the one or more electrical connections may comprise multiple electrical connections, and the pitch between at least some of the multiple electrical connections may be less than 50 micrometers; (4) the apparatus may further comprise flat probe components and a first plate; each of the flat probe components, respectively, may include one or more electrodes configured for detecting electrical activity in living tissue; for each of the one or more electrical connections, respectively, the first surface may be on the first plate and the second surface may be on one of the flat probe components; the first plate may have first plate holes; and each of the flat probe components, respectively, may include a male portion that is inserted into one of the first plate holes; (5) each respective male portion, out of at least some of the male portions, may be fastened to the first plate by at least one fastener, and the at least one fastener may be configured to allow insertion of the respective male portion into, and to restrain removal of the respective male portion from, a first plate hole; (6) the at least one fastener may comprise one or more flexible parts; (7) the at least one fastener may comprise one or more flexible parts that are configured, after the insertion, to snap into a position that restrains the removal; (8) each respective male portion may have at least one stabilization hole; the apparatus may further comprise a stabilization device, which stabilization device includes prongs; each of the prongs, respectively, may be inserted through stabilization holes in more than one of the male portions; and each respective prong out of at least some of the prongs may include a flexible element that allows insertion of the respective prong into stabilization holes and restrains removal of the respective prong from stabilization holes; (9) the apparatus may further comprise a second plate; the second plate may have holes; part of each of the flat probe components, respectively, may be inserted into a hole in the second plate; (10) the apparatus may further comprise a first interlocking part and a second interlocking part; the first and second interlocking parts each may have multiple V-shaped slots; each of the V-shaped slots, respectively, may be in contact with and compress a flat probe component out of the flat probe components; the first and second interlocking parts each may include flexible structures; and the flexible structures may allow the first and second interlocking parts to move closer to each other and may restrain the first and second interlocking parts from moving apart from each other; (11) the electrical deposition may comprise electroplating; and (12) the electrical deposition may comprise electroless deposition.

In some implementations of this invention, electrical deposition is used to bridge a gap between two surfaces that are orthogonal to each other (or off-angle with respect to each other). In some implementations of this invention, electrical deposition is used to bridge a gap between two surfaces that are orthogonal to each other (or off-angle with respect to each other), as of immediately before the electrical deposition (including any bump formation) starts.

In some implementations of this invention, two or more of the following are parallel (or substantially parallel) to each other: a surface of the base plate (e.g. 201, 1307), a surface of the back plate (e.g., 1401, 1303), and the plane in which the prongs of the stabilizer (e.g. 301, 1305) lie.

In some implementations of this invention, a planar (or substantially planar or primary) surface of each of the array structures or flat probe components (e.g. 101, 1309), respectively, is off angle with respect to one or more of the following: (1) the plane in which the prongs of the stabilizer (e.g. 301, 1305) lie; (2) a planar (or substantially planar or primary) surface of the base plate (e.g. 201, 1307) and (3) a planar (or substantially planar or primary) surface of the back plate (e.g., 1401, 1303).

Conclusion

It is to be understood that the methods and apparatus which have been described above are merely illustrative applications of the principles of the invention. Numerous modifications may be made by those skilled in the art without departing from the scope of the invention. The scope of the invention is not to be limited except by the claims that follow.

What is claimed is:

1. A method comprising fabrication of at least one electrical connection between a first surface and a second surface by electrical deposition, wherein:
   (a) the first and second surfaces are separated, except for the at least one electrical connection, by a gap of not more than 100 micrometers;
   (b) the first and second surfaces are off angle with respect to each other;
   (c) the first surface is on a first plate and the second surface is on an array structure;
   (d) the array structure comprises a set of elongated probes;
   (e) the first plate has first plate holes; and
   (f) the array structure includes a male portion that is inserted into one of the first plate holes.

2. The method of claim 1, wherein the electrical deposition comprises electroplating.

3. The method of claim 1, wherein the electrical deposition comprises electroless deposition.

4. The method of claim 1, wherein the at least one electrical connection comprises multiple electrical connections, and the pitch between at least some of the multiple electrical connections is less than 50 micrometers.

5. The method of claim 4, wherein the pitch between at least some of the multiple electrical connections is less than 40 micrometers.

6. The method of claim 5, wherein the pitch between at least some of the multiple electrical connections is less than 30 micrometers.

7. The method of claim 1, wherein the method further comprises making a bump on the first surface, a bump on the second surface or a bump on both the first and second surfaces, respectively, by electrical deposition while the first and second surfaces are separated by a distance of more than 100 micrometers and before making the at least one electrical connection across the gap.

8. Apparatus that includes one or more electrical connections,
   wherein:
   (a) each of the one or more electrical connections, respectively, is a product of electrical deposition and joins a first surface and a second surface;
   (b) the first and second surfaces are off angle with respect to each other and are separated, except for the one or more electrical connections, by a gap of not more than 100 micrometers;
   (c) the apparatus further comprises array structures and a first plate;
   (d) each of the array structures, respectively, comprises a set of elongated probes;
   (e) for at least some of the one or more electrical connections, respectively, the first surface is on the first plate and the second surface is on one of the array structures;
   (f) the first plate has first plate holes; and
   (g) each of the array structures, respectively, includes a male portion that is inserted into one of the first plate holes.

9. The apparatus of claim 8, wherein the electrical deposition comprises electroplating.

10. The apparatus of claim 8, wherein the electrical deposition comprises electroless deposition.

11. The apparatus of claim 8, wherein the one or more electrical connections comprise multiple electrical connections, and the pitch between at least some of the multiple electrical connections is less than 50 micrometers.

12. The apparatus of claim 8, wherein each respective male portion, out of at least some of the male portions, is fastened to the first plate by at least one fastener, the at least one fastener being configured to allow insertion of the respective male portion into, and to restrain removal of the respective male portion from, a first plate hole.

13. The apparatus of claim 12, wherein the at least one fastener comprises one or more hooks.

14. The apparatus of claim 12, wherein the at least one fastener is configured to snap, after the insertion, into a position that restrains the removal.

15. The apparatus of claim 8, wherein:
    each respective male portion has at least one stabilization hole;
    the apparatus further comprises a stabilization device, which stabilization device includes prongs;
    each of the prongs, respectively, is inserted through stabilization holes in more than one of the male portions; and each respective prong out of at least some of the prongs includes a hook that allows insertion of the respective prong into stabilization holes and restrains removal of the respective prong from stabilization holes.

16. The apparatus of claim 15, wherein:

the apparatus further comprises a second plate;

the second plate has holes; and part of each of the array structures, respectively, is inserted into a hole in the second plate.

17. The apparatus of claim 8, wherein:

the apparatus further comprises a first alignment part and a second alignment part;

the first and second alignment parts each have multiple V-shaped slots;

each of the V-shaped slots, respectively, is in contact with and compresses an array structure;

the first and second alignment parts each include fasteners; and the fasteners allow the first and second alignment parts to move closer to each other and restrain the first and second alignment parts from moving apart from each other.

18. The apparatus of claim 8, wherein the electrical deposition comprises electroplating.

19. The apparatus of claim 8, wherein the electrical deposition comprises electroless deposition.

* * * * *